(12) United States Patent
Yagi

(10) Patent No.: US 8,811,444 B2
(45) Date of Patent: Aug. 19, 2014

(54) SEMICONDUCTOR INTEGRATED DEVICE AND METHOD FOR PRODUCING THE SAME

(71) Applicant: Sumitomo Electric Industries, Ltd., Osaka (JP)

(72) Inventor: Hideki Yagi, Machida (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 44 days.

(21) Appl. No.: 13/733,264

(22) Filed: Jan. 3, 2013

(65) Prior Publication Data

US 2013/0177037 A1     Jul. 11, 2013

(30) Foreign Application Priority Data

Jan. 6, 2012   (JP) ................................. 2012-001352

(51) Int. Cl.
  *H01S 3/10* (2006.01)
  *H01S 3/20* (2006.01)
  *H01S 5/00* (2006.01)

(52) U.S. Cl.
  USPC .............................. 372/50.1; 372/26; 372/54

(58) Field of Classification Search
  USPC ............................................. 372/26, 50.1, 54
  See application file for complete search history.

(56) References Cited

FOREIGN PATENT DOCUMENTS

JP        2008-10484        1/2008

*Primary Examiner* — Armando Rodriguez
(74) *Attorney, Agent, or Firm* — Smith, Gambrell & Russell, LLP

(57) ABSTRACT

A semiconductor integrated device includes a light-emitting portion including a first lower mesa, a first lower buried layer provided on a side surface of the first lower mesa, a first upper mesa provided above the first lower mesa, and a first upper buried layer provided on a side surface of the first upper mesa; and an optical modulator portion including a second lower mesa, a second lower buried layer provided on a side surface of the second lower mesa, a second upper mesa provided above the second lower mesa, and a second upper buried layer provided on a side surface of the second upper mesa. The first and second lower mesas include first and second core layers optically coupled to each other. The first and second lower buried layers are composed of a semi-insulating semiconductor. The first and second upper buried layers are composed of a resin material.

10 Claims, 17 Drawing Sheets

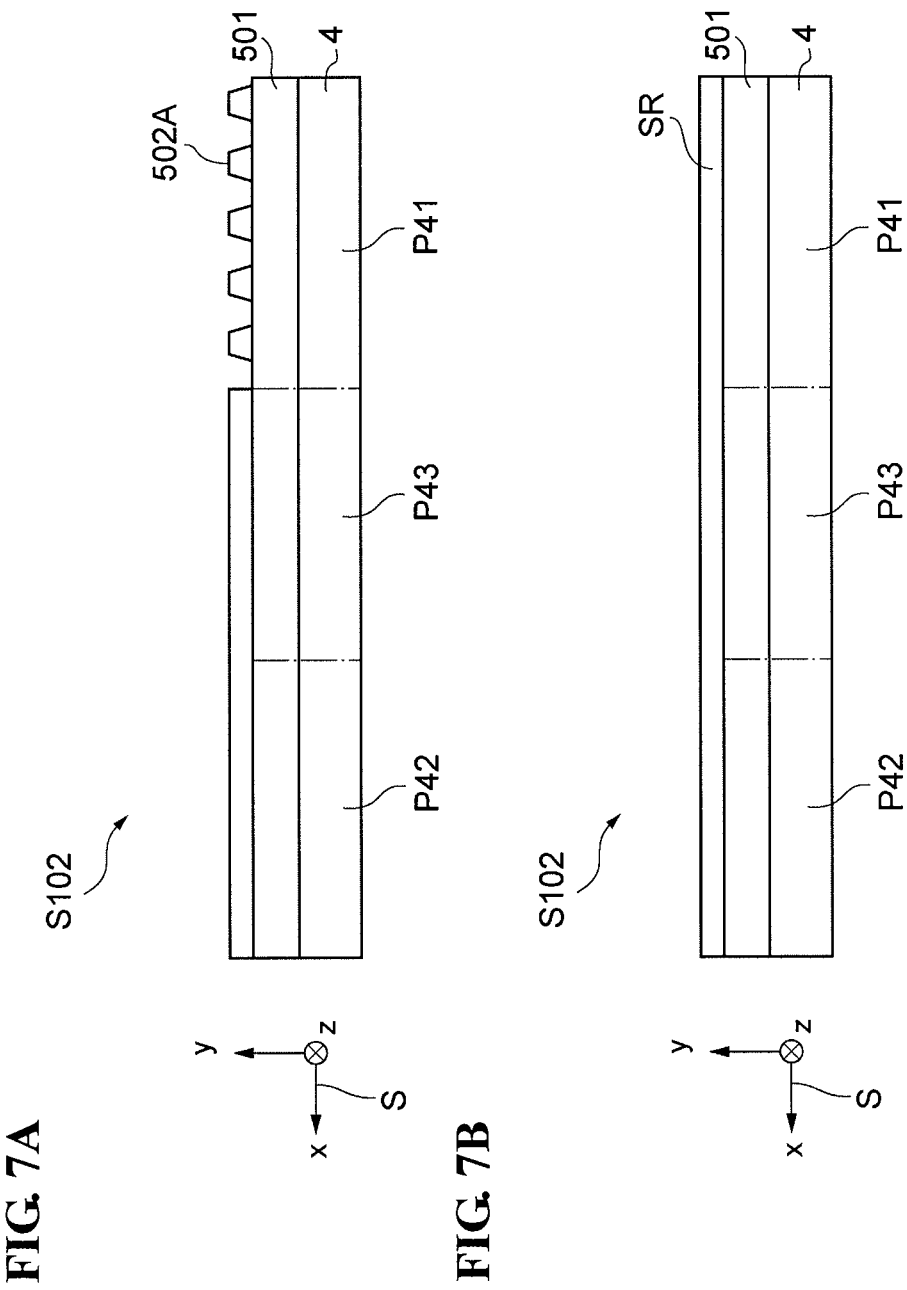

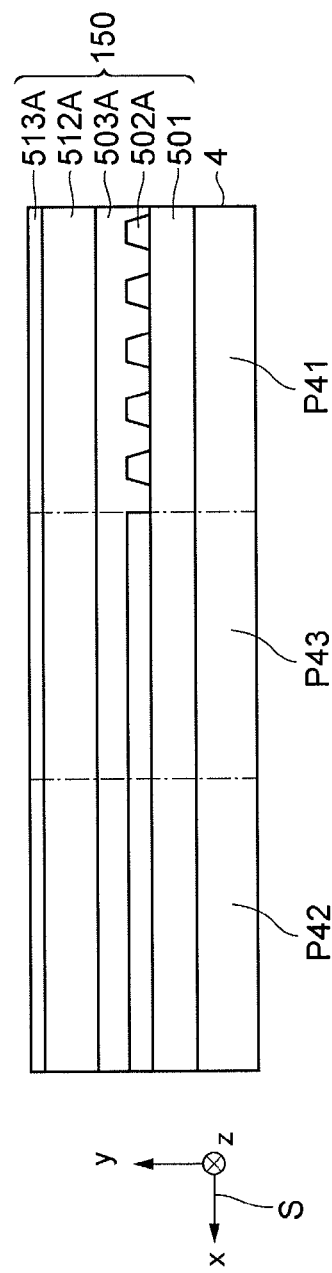
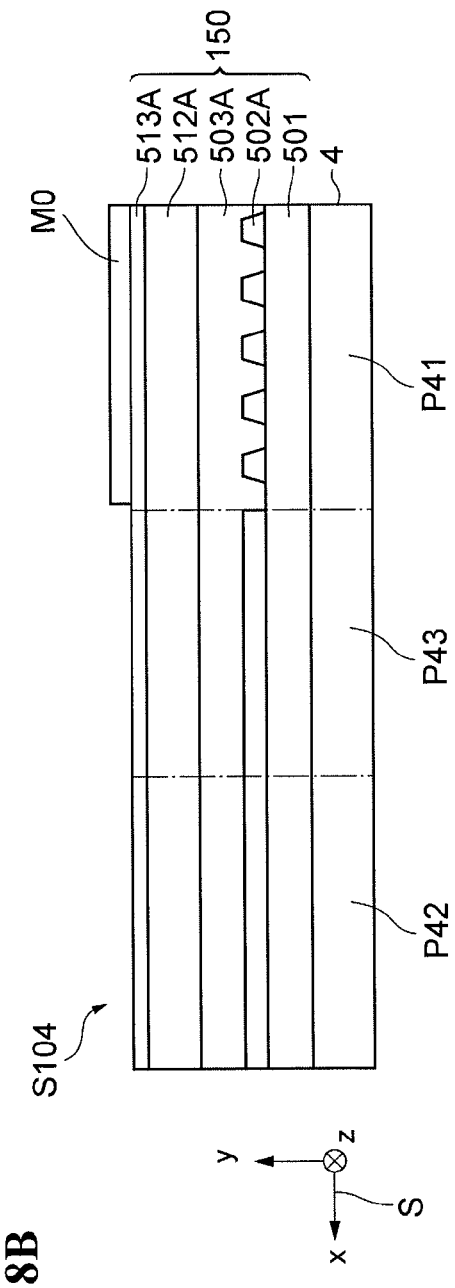

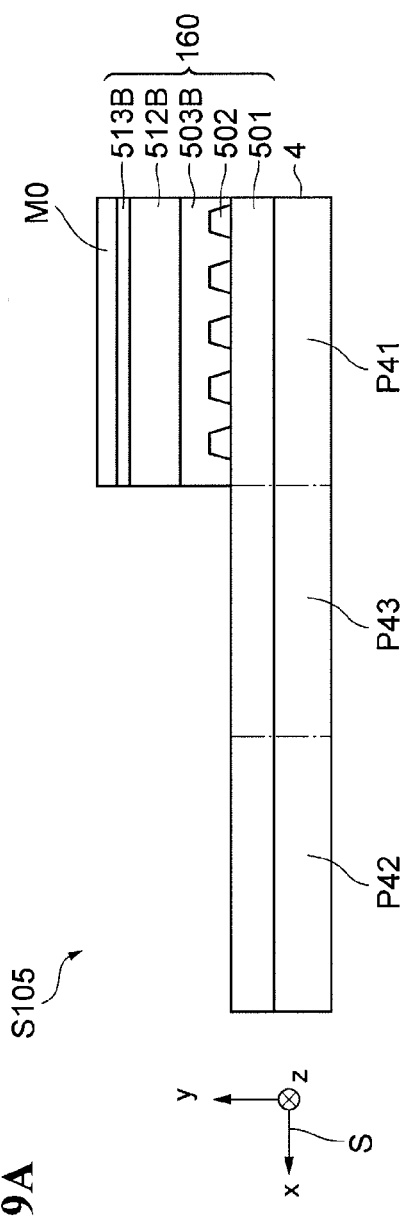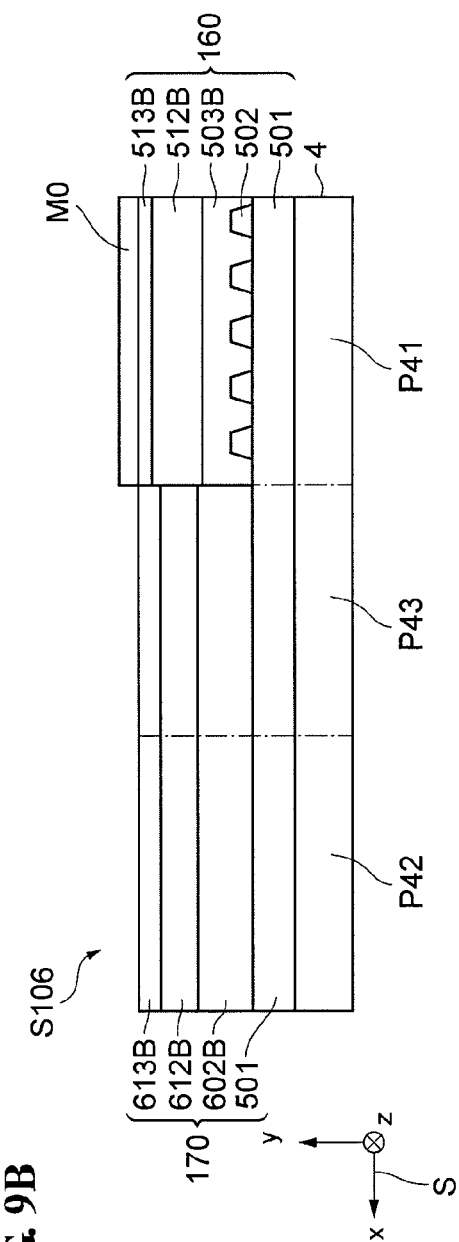

SEMICONDUCTOR INTEGRATED DEVICE AND METHOD FOR PRODUCING THE SAME

BACKGROUND OF THE INVENTION

1. Field of the Invention

The present invention relates to a semiconductor integrated device and a method for producing the semiconductor integrated device.

2. Description of the Related Art

Japanese Unexamined Patent Application Publication No. 2008-10484 discloses an optical integrated device in which a semiconductor laser and an optical modulator are integrated on a single semiconductor substrate. As the semiconductor laser, a distributed feedback laser (DFB laser) is exemplified. As the optical modulator, an electro-absorption (EA) modulator is exemplified. Each of the semiconductor laser and the optical modulator has an optical waveguide structure. The optical waveguide structure of each of the semiconductor laser and the optical modulator includes a semiconductor mesa. Japanese Unexamined Patent Application Publication No. 2008-10484 discloses that the semiconductor mesas including the semiconductor laser and the optical modulator are buried by a semi-insulating semiconductor, such as Fe-doped InP.

SUMMARY OF THE INVENTION

Like the optical integrated device disclosed in Japanese Unexamined Patent Application Publication No. 2008-10484, when both optical waveguides of a semiconductor laser and an optical modulator are buried by a semi-insulating semiconductor, properties of the semiconductor laser is ensured. In the optical modulator, however, the degree of optical confinement in the width direction of the mesa may be relatively reduced to increase optical loss. Furthermore, it is difficult to achieve a wide-bandwidth (low-capacity) optical modulator.

To overcome the foregoing problems, for example, it is conceived that the semiconductor mesa is buried by a resin in place of the semi-insulating semiconductor. In this case, although properties of the optical modulator are improved, non-radiative recombination is disadvantageously increased in the light-emitting portion in the semiconductor laser. It is thus difficult to ensure the properties of the light-emitting portion in the semiconductor laser.

Japanese Unexamined Patent Application Publication No. 2008-10484 also discloses a semiconductor optical device in which the waveguide of each of the semiconductor laser and the optical modulator has a ridge structure. In general, the semiconductor laser having the ridge structure has a high threshold current, a low emission efficiency, and a low relaxation oscillation frequency, compared with the semiconductor laser having a mesa structure. As described above, in the optical integrated device disclosed in Japanese Unexamined Patent Application Publication No. 2008-10484, it is difficult to ensure both properties of the semiconductor laser and the optical modulator.

Accordingly, a semiconductor integrated device according to the present invention includes a substrate including a first portion, a second portion, and a third portion arranged in a predetermined direction, the third portion being arranged between the first portion and the second portion; a light-emitting portion including a first lower mesa provided above the first portion, a first lower buried layer provided on a side surface of the first lower mesa and above the first portion, a first upper mesa provided above the first lower mesa, and a first upper buried layer provided on a side surface of the first upper mesa and above the first lower buried layer, the first lower mesa including a first core layer; and an optical modulator portion including a second lower mesa provided above the second portion, a second lower buried layer provided on a side surface of the second lower mesa and above the second portion, a second upper mesa provided above the second lower mesa, and a second upper buried layer provided on a side surface of the second upper mesa and above the second lower buried layer, the second lower mesa including a second core layer. The first core layer and the second core layer are optically coupled to each other. The first lower buried layer and the second lower buried layer are composed of a semi-insulating semiconductor. In addition, the first upper buried layer and the second upper buried layer are composed of a resin material.

In the semiconductor integrated device, each of the light-emitting portion and the optical modulator portion includes the lower mesa including the core layer, and the upper mesa provided above the lower mesa. Each of the light-emitting portion and the optical modulator portion includes the lower buried layer configured to bury the lower mesa therein, and the upper buried layer configured to bury the upper mesa therein. Each of the lower buried layers is composed of the semi-insulating semiconductor. Each of the upper buried layers is composed of the resin material. As described above, the lower mesas including the core layers are buried by the semi-insulating semiconductor, thereby suppressing an increase in non-radiative recombination in the light-emitting portion. On the other hand, the upper mesas are buried by the resin material having a relatively low refractive index (dielectric constant). As a result, the optical modulator portion has a low capacitance and an optical confinement in the optical modulator portion is improved. As described above, in the semiconductor integrated device, it is possible to ensure both properties of the light-emitting portion and the optical modulator portion.

The semiconductor integrated device according to the present invention may further include an isolation portion provided above the third portion. The isolation portion may include a third lower mesa provided above the third portion, a third lower buried layer provided on a side surface of the third lower mesa and above the third portion, an isolation groove provided above the third lower mesa and the third lower buried layer and provided between the first upper mesa and the second upper mesa, and a resin component arranged in the isolation groove and composed of the resin material. In addition, the third lower mesa may include a third core layer that optically couples the first core layer to the second core layer. In this semiconductor integrated device, the isolation groove is provided between the upper mesas of the light-emitting portion and the optical modulator portion, and the resin component is arranged in the isolation groove. This ensures electrical isolation between the light-emitting portion and the optical modulator portion and improving the properties of the light-emitting portion and the optical modulator portion.

The semiconductor integrated device according to the present invention may further include a semiconductor layer arranged on the first lower mesa, the second lower mesa, the first lower buried layer, and the second lower buried layer, the semiconductor layer containing Al. The first upper mesa, the second upper mesa, the first upper buried layer, and the second upper buried layer may be provided on the semiconductor layer containing Al. In this semiconductor integrated device, for example, when the first and second upper mesas are formed by dry etching such as a reactive ion etching (ME), the semiconductor layer containing Al can be used as an etch-stop layer. In this case, the semiconductor layer may be composed of AlInAs.

In the semiconductor integrated device according to the present invention, the first lower mesa and the first upper mesa may include a stripe-shaped mesa structure extending in the predetermined direction. The second lower mesa and the second upper mesa may include a stripe-shaped mesa structure extending in the predetermined direction. Preferably, the center of the first lower mesa in the width direction intersecting with the predetermined direction is substantially matched to the center of the first upper mesa in the width direction intersecting with the predetermined direction. In addition, the center of the second lower mesa in the width direction intersecting with the predetermined direction is substantially matched to the center of the second upper mesa in the width direction intersecting with the predetermined direction.

In the semiconductor integrated device according to the present invention, the width of the first upper mesa in a direction intersecting with the predetermined direction may be smaller than the width of the first lower mesa in a direction intersecting with the predetermined direction. The width of the second upper mesa in a direction intersecting with the predetermined direction may be smaller than the width of the second lower mesa in a direction intersecting with the predetermined direction.

In the semiconductor integrated device according to the present invention, the first core layer of the first lower mesa may include an active layer configured to generate light. Preferably, the second core layer of the second lower mesa includes a layer configured to modulate light from the first core layer.

In the semiconductor integrated device according to the present invention, the semi-insulating semiconductor may be composed of Fe-doped InP. The resin material may be composed of a bisbenzocyclobutene (BCB) resin.

In the semiconductor integrated device according to the present invention, preferably, the optical modulator portion includes a Mach-Zehnder optical modulator including a waveguide that includes the second lower mesa and the second upper mesa provided above the second lower mesa.

BRIEF DESCRIPTION OF THE DRAWINGS

FIGS. 7A and 7B each illustrate a main step in a method for producing a semiconductor integrated device according to an embodiment of the present invention.

FIGS. 8A and 8B each illustrate a main step in a method for producing a semiconductor integrated device according to an embodiment of the present invention.

FIGS. 9A and 9B each illustrate a main step in a method for producing a semiconductor integrated device according to an embodiment of the present invention.

DESCRIPTION OF THE PREFERRED EMBODIMENTS

Figure 1:
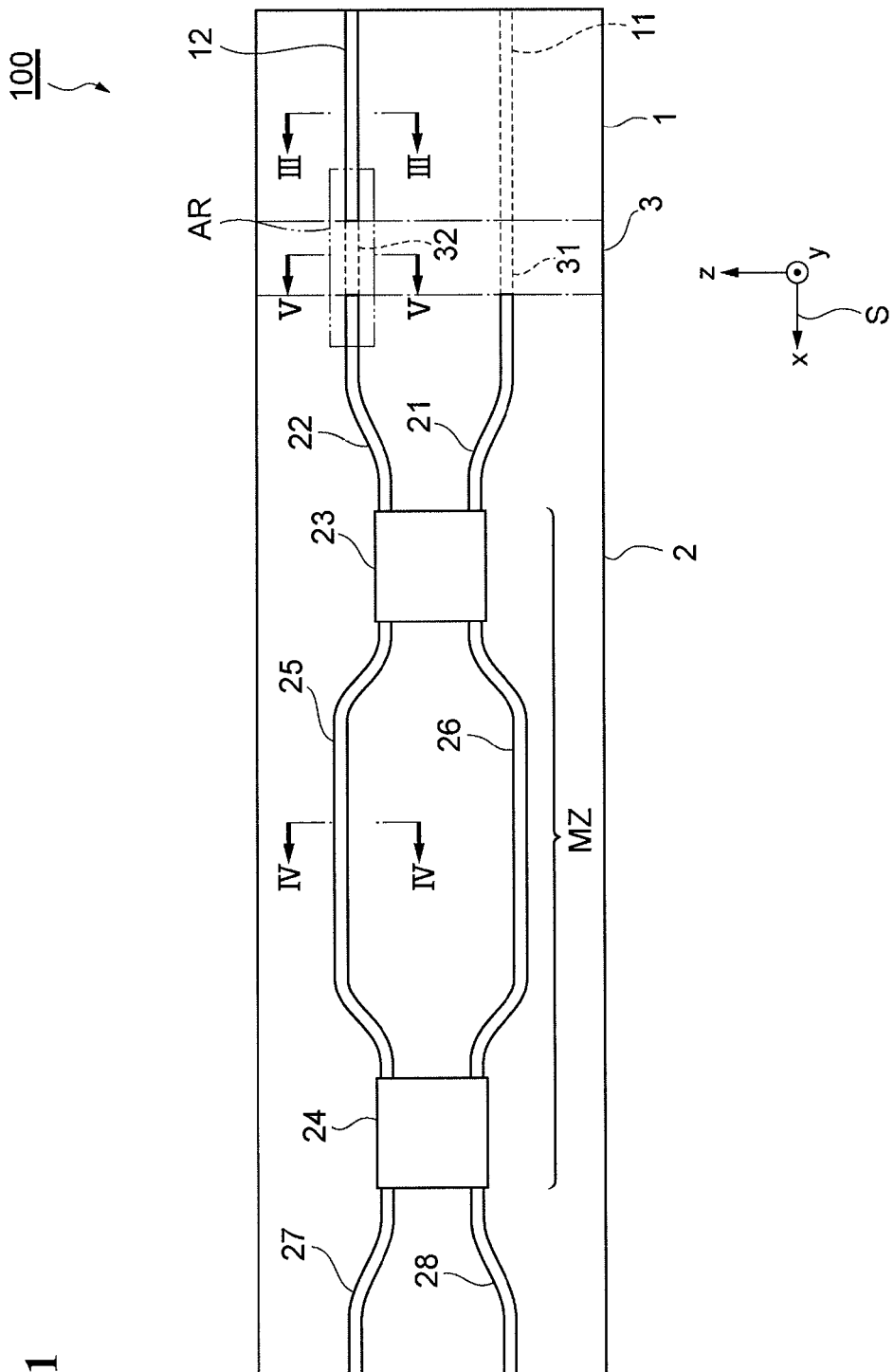
FIG. 1 is a plan view of a semiconductor integrated device according to an embodiment of the present invention.

A semiconductor integrated device according to an embodiment of the present invention and a method for producing the semiconductor integrated device according to an embodiment of the present invention will be described in detail below with reference to attached drawings. In the following descriptions of the drawings, the same elements are designated using the same reference numerals, and descriptions are not redundantly repeated.

FIG. 1 is a plan view illustrating a semiconductor integrated device according to an embodiment of the present invention. In the following figures, a rectangular coordinate system S is illustrated. As illustrated in FIG. 1, a semiconductor integrated device 100 includes a light-emitting portion 1, an optical modulator portion 2 and an isolation portion 3. An example of the light-emitting portion 1 is a distributed feedback laser (DFB laser) and so forth. Examples of the optical modulator portion 2 include a Mach-Zehnder optical modulator and an electro-absorption (EA) modulator.

The light-emitting portion 1 includes a waveguide 11 and a waveguide 12 extending in a predetermined direction (here, the x-axis direction). The waveguides 11 and 12 are arranged in a direction (here, the z-axis direction) intersecting with the predetermined direction. The waveguides 11 and 12 are arranged substantially in parallel with each other. Each of the waveguides 11 and 12 includes a core layer configured to generate light. The waveguides 11 and 12 are optically coupled to waveguides 21 and 22, respectively, of the optical modulator portion 2 described below.

The optical modulator portion 2 includes optical couplers 23 and 24 arranged in that order in the x-axis direction. The optical couplers 23 and 24 are, for example, 2×2 multimode interference (MMI) couplers. The optical modulator portion 2 includes the waveguides 21 and 22. The waveguides 21 and 22 are arranged in that order in the z-axis direction. An end portion of the waveguide 21 is optically coupled to the waveguide 11. An end portion of the waveguide 22 is optically coupled to the waveguide 12. The other end portion of each of the waveguides 21 and 22 is connected to the optical coupler 23.

The optical modulator portion 2 includes waveguides 25 and 26. The waveguides 25 and 26 are arranged in that order in the z-axis direction. An end portion of each of the waveguides 25 and 26 is connected to the optical coupler 23. The other end of each of the waveguides 25 and 26 is connected to the optical coupler 24. The optical modulator portion 2 includes waveguides 27 and 28. The waveguides 27 and 28 are arranged in that order in the z-axis direction. An end of each of the waveguides 27 and 28 is connected to the optical coupler 24. Each of the waveguides 21, 22, 25, 26, 27, and 28 includes a core layer configured to modulate light. The optical couplers 23 and 24 and the waveguides 25 and 26 constitute, for example, a Mach-Zehnder optical modulator MZ.

The isolation portion 3 is arranged between the light-emitting portion 1 and the optical modulator portion 2. The isolation portion 3 electrically isolates the light-emitting portion 1 from the optical modulator portion 2. The isolation portion 3 includes waveguides 31 and 32. The waveguides 31 and 32 are arranged in that order in the z-axis direction. The waveguides 31 and 32 are arranged substantially in parallel with each other. An end portion of the waveguide 31 is connected to the waveguide 11. An end portion of the waveguide 32 is connected to the waveguide 12. The other end of the waveguide 31 is connected to the waveguide 21. The other end of the waveguide 32 is connected to the waveguide 22. The waveguide 31 includes a core layer configured to optically couple the core layer of the waveguide 11 to the core layer of the waveguide 21. The waveguide 32 includes a core layer configured to optically couple the core layer of the waveguide 12 to the core layer of the waveguide 22.

In the semiconductor integrated device 100 having the foregoing structure, light components generated in the waveguides 11 and 12 of the light-emitting portion 1 are incident on the waveguides 21 and 22 of the optical modulator portion 2 through the waveguides 31 and 32 of the isolation portion 3. The light components incident on the waveguides 21 and 22 are incident on the waveguides 25 and 26 through the optical coupler 23. The light components incident on the waveguides 25 and 26 are modulated while propagating through the waveguides 25 and 26 and are incident on the optical coupler 24. The modulated light components incident on the optical coupler 24 are emitted to the outside of the semiconductor integrated device 100 through the waveguides 27 and 28.

Figure 2:
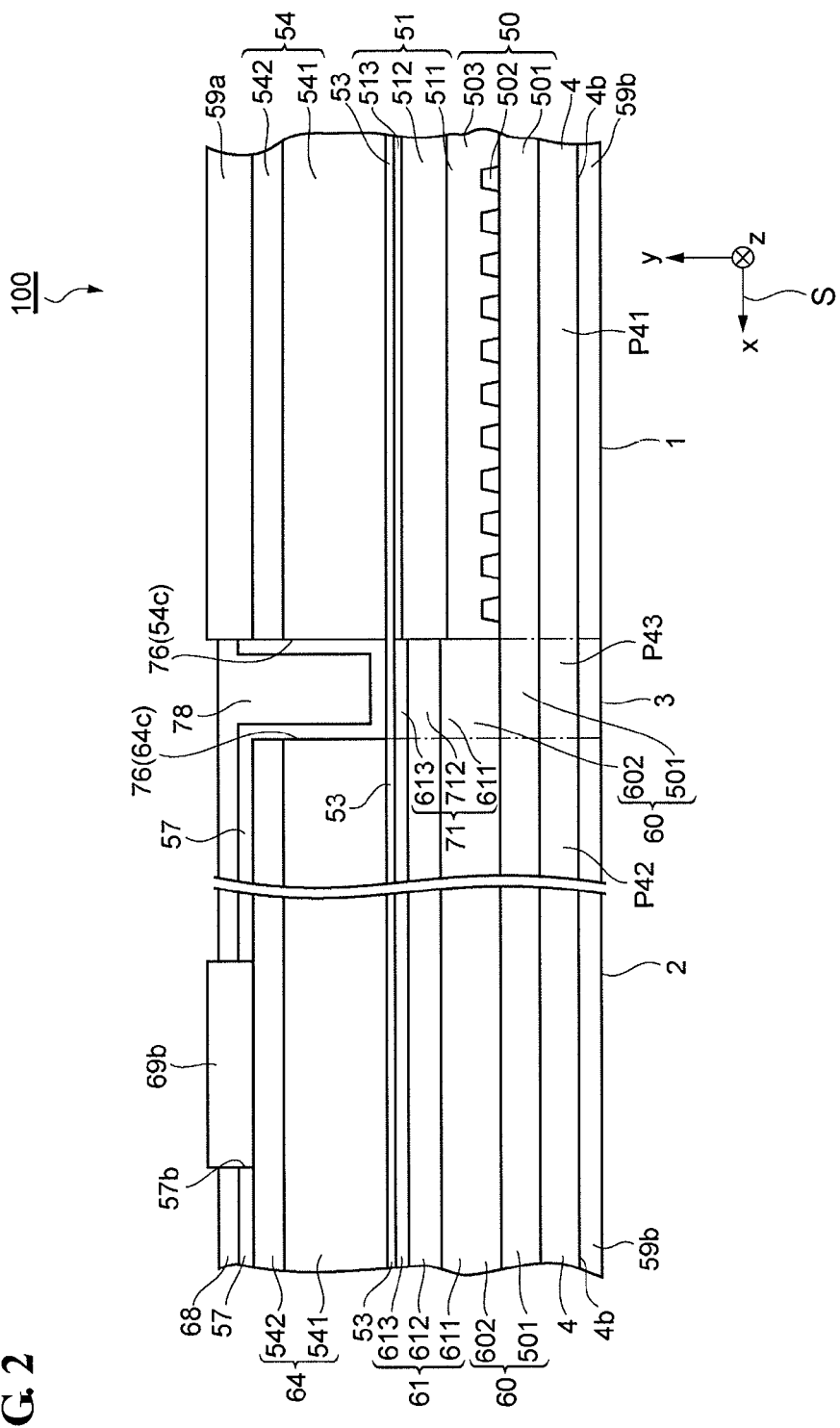
FIG. 2 is a schematic fragmentary cross-sectional view of the semiconductor integrated device illustrated in FIG. 1 in a waveguiding direction of light.

FIG. 2 is a schematic fragmentary cross-sectional view of the semiconductor integrated device illustrated in FIG. 1 in a waveguiding direction of light (i.e., in the direction of the optical axis). As illustrated in FIG. 2, the semiconductor integrated device 100 includes a semiconductor substrate 4. The semiconductor substrate 4 serves as a substrate in this embodiment. The semiconductor substrate 4 has, for example, a first conductivity type (e.g., n-type). The semiconductor substrate 4 is composed of a III-V group compound semiconductor, such as InP. The semiconductor substrate 4 includes a first portion P41, a second portion P42, and a third portion P43. The third portion P43 is arranged between the first portion P41 and the second portion P42. The light-emitting portion 1 is provided on the first portion P41. The optical modulator portion 2 is provided on the second portion P42. The isolation portion 3 is provided on the third portion P43.

Figure 3:
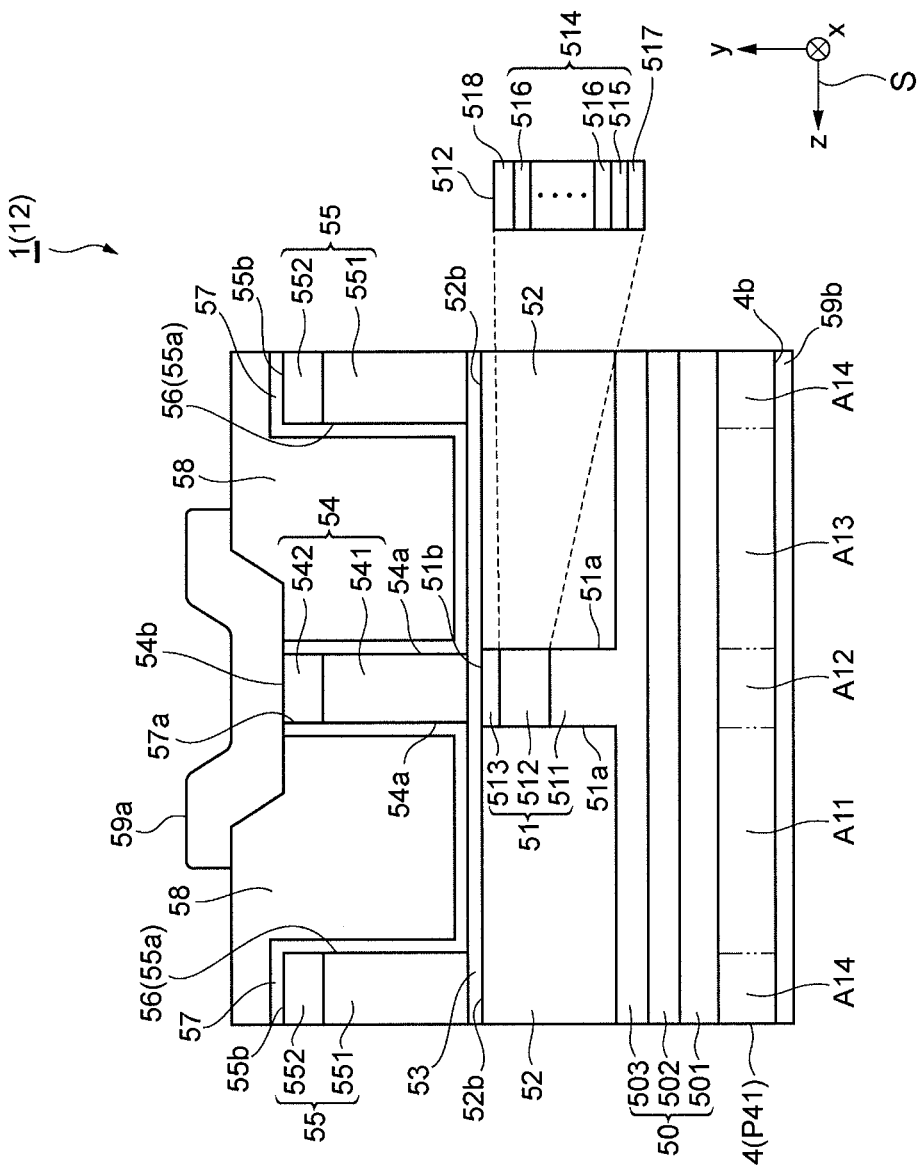
FIG. 3 is a schematic fragmentary cross-sectional view taken along line III-III in FIG. 1.

The light-emitting portion 1 will be described in detail below with reference to FIGS. 2 and 3. FIG. 3 is a schematic fragmentary cross-sectional view taken along line in FIG. 1. The first portion P41 of the semiconductor substrate 4 includes a first region A11, a second region A12, a third region A13, and fourth regions A14. The first, second, and third regions A11, A12, and A13 are arranged in that order in the z-axis direction. The fourth regions A14 are located on a side of the first region A11 and a side of the third region A13 in the z-axis direction.

The light-emitting portion 1 includes a base portion 50. The base portion 50 is provided on the first, second, third, and fourth regions A11, A12, A13, and A14. The base portion 50 includes a buffer layer 501, a grating layer 502, and a semiconductor layer 503 provided, in that order, on the semiconductor substrate 4. The buffer layer 501 has, for example, the first conductivity type. The buffer layer 501 is composed of a III-V group compound semiconductor, such as InP.

The grating layer 502 has, for example, the first conductivity type. The grating layer 502 is composed of a III-V group compound semiconductor, such as GaInAsP. The grating layer 502 includes a pattern of projections and recesses that are arranged at a predetermined period in the waveguiding direction of light (here, in the x-axis direction). The grating layer 502 has a bandgap wavelength of, for example, about 1300 nm. The semiconductor layer 503 has, for example, the first conductivity type. The semiconductor layer 503 is composed of a III-V group compound semiconductor, such as InP. The projections and recesses of the grating layer 502 are buried by the semiconductor layer 503. The grating layer 502 having the pattern of periodic projections and recesses and the semiconductor layer 503 in which the pattern of projections and recesses of the grating layer 502 is buried constitute a diffraction grating.

The light-emitting portion 1 includes a lower mesa (first lower mesa) 51. Especially, the lower mesa 51 is, for example, a stripe-shaped mesa. Hereinafter, the lower mesa 51 is named as lower stripe-shaped mesa 51. The lower stripe-shaped mesa 51 is provided above the second region A12 of the first portion P41 and on the base portion 50. The height of the lower stripe-shaped mesa 51 from the upper surface of the base portion 50 is, for example, about 1.0 μm. The lower stripe-shaped mesa 51 extends in the x-axis direction. The lower stripe-shaped mesa 51 includes a semiconductor layer 511, a core layer (first core layer) 512, and a capping layer 513 provided, in that order, on the base portion 50. The semiconductor layer 511 has, for example, the first conductivity type. The semiconductor layer 511 is composed of a III-V group compound semiconductor, such as InP. The semiconductor layer 511 is formed integrally with the semiconductor layer 503. The capping layer 513 is composed of a III-V group compound semiconductor, such as undoped InP.

The core layer 512 includes an active layer 514 configured to generate light. The active layer 514 is composed of a III-V group compound semiconductor, such as undoped GaInAsP. For example, the active layer 514 has a multi quantum well (MQW) structure in which well layers 515 and barrier layers 516 are alternately stacked. A thickness and bandgap wavelength of the well layer 515 are adjusted to emit a light having a wavelength of, for example, 1.55 μm from MQW structure. For example, each of the well layers 515 has a thickness of about 6 nm and a bandgap wavelength of about 1.58 μm. For example, each of the barrier layers 516 has a thickness of about 9 nm and a bandgap wavelength of about 1.20 μm.

The core layer 512 may further include a lower separate confinement heterostructure (SCH) layer 517 and an upper separate confinement heterostructure (SCH) layer 518. The lower and upper separate confinement heterostructure (SCH) layers 517 and 518 are arranged so as to sandwich the active layer 514 in the height direction (here, in the y-axis direction) of the lower stripe-shaped mesa 51. The lower separate confinement heterostructure (SCH) layer 517 has, for example, the first conductivity type. The lower separate confinement heterostructure (SCH) layer 517 is composed of a III-V group compound semiconductor, such as GaInAsP. The lower separate confinement heterostructure (SCH) layer 517 has a bandgap wavelength of, for example, about 1.20 μm. The upper separate confinement heterostructure (SCH) layer 518 is composed of a III-V group compound semiconductor, such as undoped GaInAsP. The upper separate confinement heterostructure (SCH) layer 518 has a bandgap wavelength of, for example, about 1.20 μm.

The light-emitting portion 1 includes lower buried layers (first lower buried layers) 52. The lower buried layers 52 are provided on side surfaces 51a of the lower stripe-shaped mesa 51 (i.e., side surfaces of the semiconductor layer 511, the core layer 512, and the capping layer 513), above the first region A11, the third region A13, and the fourth regions A14, and on the base portion 50 so as to bury the lower stripe-shaped mesa 51. The lower buried layers 52 are composed of a semi-insulating III-V group compound semiconductor, such as Fe-doped InP. Upper surfaces 52b of the lower buried layers 52 are substantially flush with the upper surface 51b of the lower stripe-shaped mesa 51 (i.e., a surface of the capping layer 513).

The light-emitting portion 1 includes a semiconductor layer 53. The semiconductor layer 53 is provided on the lower stripe-shaped mesa 51 and the lower buried layers 52 in the first, second, third, and fourth regions A11, A12, A13, and A14. The semiconductor layer 53 is composed of a III-V group compound semiconductor, such as undoped AlInAs. The semiconductor layer 53 has a thickness of, for example, 50 nm or more and 100 nm or less. The semiconductor layer 53 covers the upper surface 51b of the lower stripe-shaped mesa 51 and the upper surfaces 52b of the lower buried layers 52.

The light-emitting portion 1 includes an upper mesa (first upper mesa) 54. Especially, the upper mesa 54 is, for example, a stripe-shaped mesa. Hereinafter, the upper mesa 54 is named as upper stripe-shaped mesa 54. The upper stripe-shaped mesa 54 is provided above the second region A12 and the lower stripe-shaped mesa 51 and on the semiconductor layer 53. In particular, the upper stripe-shaped mesa 54 is provided in such a manner that the center of the upper stripe-shaped mesa 54 in the width direction (z-axis direction) intersecting with the x-axis direction is substantially matched to the center of the lower stripe-shaped mesa 51 in the z-axis direction. The height of the upper stripe-shaped mesa 54 from the upper surface of the semiconductor layer 53 is, for example, about 1.8 μm. The upper stripe-shaped mesa 54 extends in the x-axis direction. The mesa width of the upper stripe-shaped mesa 54 is narrower than the mesa width of the lower stripe-shaped mesa 51. For example, the mesa width of the upper stripe-shaped mesa 54 is about 1.6 and the mesa width of the lower stripe-shaped mesa 51 is about 1.8 μm.

The upper stripe-shaped mesa 54 includes a cladding layer 541 and a contact layer 542. The cladding layer 541 has, for example, a second conductivity type (e.g., p type) different from the first conductivity type. The cladding layer 541 is composed of a III-V group compound semiconductor, such as InP. The cladding layer 541 has a thickness of, for example, about 1500 nm. The contact layer 542 has, for example, the second conductivity type. The contact layer 542 is composed of a III-V group compound semiconductor, such as GaInAs. The contact layer 542 has a thickness of, for example, about 300 nm.

The light-emitting portion 1 includes terraces 55. The terraces 55 are provided above the fourth regions A14 and on the semiconductor layer 53. Each of the terraces 55 includes a cladding layer 551 and a contact layer 552 similar to the cladding layer 541 and the contact layer 542 of the upper stripe-shaped mesa 54. The light-emitting portion 1 includes trenches 56 defined by side surfaces 55a of the terraces 55 and side surfaces 54a of the upper stripe-shaped mesa 54. The trenches 56 are provided above the first region A11 and the third region A13.

The light-emitting portion 1 includes protective film 57. The protective film 57 is provided on inner surfaces of the trenches 56 (i.e., on the surface of the semiconductor layer 53, the side surfaces 54a of the upper stripe-shaped mesa 54, and the side surfaces 55a of the terraces 55) and upper surfaces 55b of the terraces 55. The protective film 57 includes an opening 57a located above the upper surface 54b of the upper stripe-shaped mesa 54. The protective film 57 is composed of a dielectric material, such as $SiO_2$ or SiN. The protective film 57 has a thickness of, for example, about 300 nm.

The light-emitting portion 1 includes upper buried layers (first upper buried layer) 58. The upper buried layers 58 are provided above the first region A11, the third region A13, the fourth regions A14, the lower buried layers 52, and the terraces 55 and on the protective film 57 so as to cover the side surfaces 54a of the upper stripe-shaped mesa 54 and bury the upper stripe-shaped mesa 54 therein. Part of each of the upper buried layers 58 is arranged in a corresponding one of the trenches 56, so that the trenches 56 are filled therewith. The upper buried layers 58 are composed of an insulating resin material, such as a bisbenzocyclobutene (BCB) resin.

The light-emitting portion 1 includes an upper electrode 59a and a lower electrode 59b. The upper electrode 59a is provided on the upper stripe-shaped mesa 54 and the upper buried layers 58. The upper electrode 59a is in contact with the upper surface 54b of the upper stripe-shaped mesa 54 (i.e., a surface of the contact layer 542) through the opening 57a of the protective film 57. The lower electrode 59b is provided on the back surface 4b of the semiconductor substrate 4.

Figure 4:
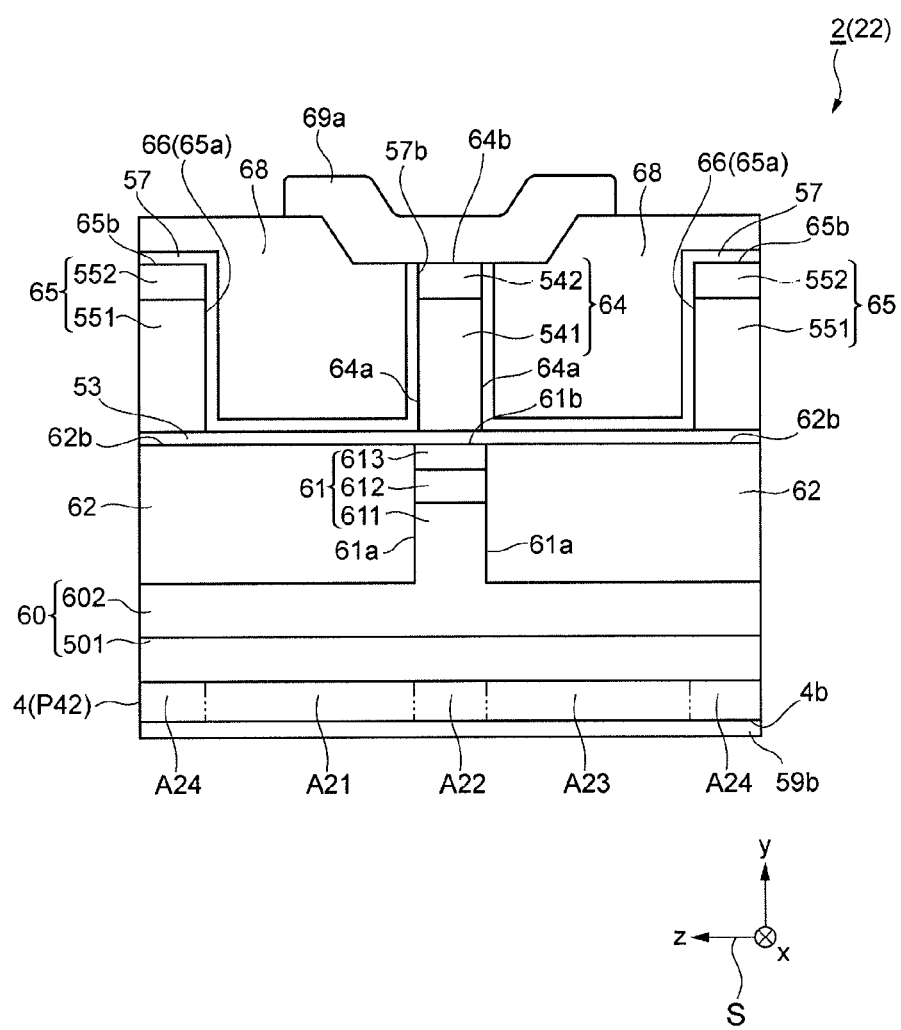
FIG. 4 is a schematic fragmentary cross-sectional view taken along line IV-IV in FIG. 1.

The optical modulator portion 2 will be described in detail with reference to FIGS. 2 and 4. FIG. 4 is a schematic fragmentary cross-sectional view taken along line IV-IV in FIG. 1. The second portion P42 of the semiconductor substrate 4 includes a first region A21, a second region A22, a third region A23, and fourth regions A24. The first, second, and third regions A21, A22, and A23 are arranged in that order in the z-axis direction. The fourth regions A24 are located on a side of the first region A21 and a side of the third region A23 in the z-axis direction.

The optical modulator portion 2 includes a base portion 60. The base portion 60 is provided on the first, second, third, and fourth regions A21, A22, A23, and A24. The base portion 60 includes the buffer layer 501 and a semiconductor layer 602 provided, in that order, on the semiconductor substrate 4. The buffer layer 501 is continuously formed from the light-emitting portion 1. The semiconductor layer 602 has, for example, the first conductivity type. The semiconductor layer 602 is composed of a III-V group compound semiconductor, such as InP.

The optical modulator portion 2 includes a lower mesa (second lower mesa) 61. Especially, the lower mesa 61 is a stripe-shaped mesa. Hereinafter, the lower mesa 61 is named as lower stripe-shaped mesa 61. The lower stripe-shaped mesa 61 is provided above the second region A22 and on the base portion 60. The height of the lower stripe-shaped mesa 61 from the upper surface of the base portion 60 is, for example, about 1.0 μm. The lower stripe-shaped mesa 61 extends in the x-axis direction. The lower stripe-shaped mesa 61 includes a semiconductor layer 611, a core layer (second core layer) 612, and a semiconductor layer 613 provided, in that order, on the base portion 60. The semiconductor layer 611 has, for example, the first conductivity type. The semiconductor layer 611 is composed of a III-V group compound semiconductor, such as InP. The semiconductor layer 611 is formed integrally with the semiconductor layer 602.

The core layer 612 is used to modulate light. The core layer 612 is composed of a III-V group compound semiconductor, such as undoped GaInAsP. The core layer 612 has a bandgap wavelength of for example, about 1400 nm. The core layer 612 is optically coupled to the core layer 512 of the light-emitting portion 1. The semiconductor layer 613 is composed of a III-V group compound semiconductor, such as undoped InP.

The optical modulator portion 2 includes lower buried layers (second lower buried layers) 62. The lower buried layers 62 are provided on side surfaces 61a of the lower stripe-shaped mesa 61 (i.e., side surfaces of the semiconductor layer 611, the core layer 612, and the semiconductor layer 613), above the first region A21, the third region A23, and the fourth regions A24, and on the base portion 60 so as to bury the lower stripe-shaped mesa 61. For example, the lower buried layers 62 are formed integrally with the lower buried layers 52 of the light-emitting portion 1 and composed of the same material as that constituting the lower buried layers 52. Thus, the lower buried layers 62 are composed of a semi-insulating III-V group compound semiconductor, such as Fe-doped InP. Upper surfaces 62b of the lower buried layers 62 are substantially flush with the upper surface 61b of the lower stripe-shaped mesa 61 (i.e., a surface of the semiconductor layer 613).

The optical modulator portion 2 includes the semiconductor layer 53 continuously formed from the light-emitting portion 1. In the optical modulator portion 2, the semiconductor layer 53 is arranged above the first, second, third, and fourth regions A21, A22, A23, and A24 and on the lower stripe-shaped mesa 61 and the lower buried layers 62.

The optical modulator portion 2 includes an upper mesa (second upper mesa) 64. Especially, the upper mesa 64 is, for example, a stripe-shaped mesa. Hereinafter, the upper mesa 64 is named as upper stripe-shaped mesa 64. The upper stripe-shaped mesa 64 is provided above the second region A22 and the lower stripe-shaped mesa 61 and on the semiconductor layer 53. In particular, the upper stripe-shaped mesa 64 is provided in such a manner that the center of the upper stripe-shaped mesa 64 in the width direction (z-axis direction) intersecting with the x-axis direction is substantially matched to the center of the lower stripe-shaped mesa 61 in the z-axis direction. The height of the upper stripe-shaped mesa 64 from the upper surface of the semiconductor layer 53 is, for example, about 1.8 µm. The upper stripe-shaped mesa 64 extends in the x-axis direction. The mesa width of the upper stripe-shaped mesa 64 is narrower than the mesa width of the lower stripe-shaped mesa 61. For example, the mesa width of the upper stripe-shaped mesa 64 is about 1.6 µm, and the mesa width of the lower stripe-shaped mesa 61 is about 1.8 µm. The upper stripe-shaped mesa 64 includes the cladding layer 541 and the contact layer 542. The upper stripe-shaped mesa 64 is formed integrally with, for example, the upper stripe-shaped mesa 54 of the light-emitting portion 1.

The optical modulator portion 2 includes terraces 65. The terraces 65 are provided above the fourth regions A24 of the second portion P42 and on the semiconductor layer 53. The terraces 65 includes the cladding layer 551 and the contact layer 552 continuously formed from the light-emitting portion 1. The terraces 65 are formed integrally with, for example, the terraces 55 of the light-emitting portion 1. The optical modulator portion 2 includes trenches 66 defined by side surfaces 65a of the terraces 65 and side surfaces 64a of the upper stripe-shaped mesa 64. The trenches 66 are provided above the first region A21 and the third region A23. The trenches 66 are formed integrally with, for example, the trenches 56 of the light-emitting portion 1.

The optical modulator portion 2 includes the protective film 57 continuously formed from the light-emitting portion 1. In the optical modulator portion 2, the protective film 57 is provided on inner surfaces of the trenches 66 (i.e., on the surface of the semiconductor layer 53, the side surfaces 64a of the upper stripe-shaped mesa 64, and the side surfaces 65a of the terraces 65) and upper surfaces 65b of the terraces 65. The protective film 57 includes an opening 57b located above the upper surface 64b of the upper stripe-shaped mesa 64.

The optical modulator portion 2 includes upper buried layers (second upper buried layers) 68. The upper buried layers 68 are provided above the first region A21, the third region A23, the fourth regions A24, the lower buried layers 62, and the terraces 65 and on the protective film 57 so as to cover the side surfaces 64a of the upper stripe-shaped mesa 64 and bury the upper stripe-shaped mesa 64 therein. Part of each of the upper buried layers 68 is arranged in a corresponding one of the trenches 66, so that the trenches 66 are filled therewith. For example, the upper buried layers 68 are formed integrally with the upper buried layers 58 of the light-emitting portion 1 and composed of the same material as that constituting the upper buried layers 58.

The optical modulator portion 2 includes an upper electrode 69a. The upper electrode 69a is provided on the upper stripe-shaped mesa 64 and the upper buried layers 68. The upper electrode 69a is in contact with the upper surface 64b of the upper stripe-shaped mesa 64 (i.e., a surface of the contact layer 542) through the opening 57b of the protective film 57. The optical modulator portion 2 includes the lower electrode 59b continuously formed from the light-emitting portion 1. Also in the optical modulator portion 2, the lower electrode 59b is provided on the back surface 4b of the semiconductor substrate 4.

Figure 5:
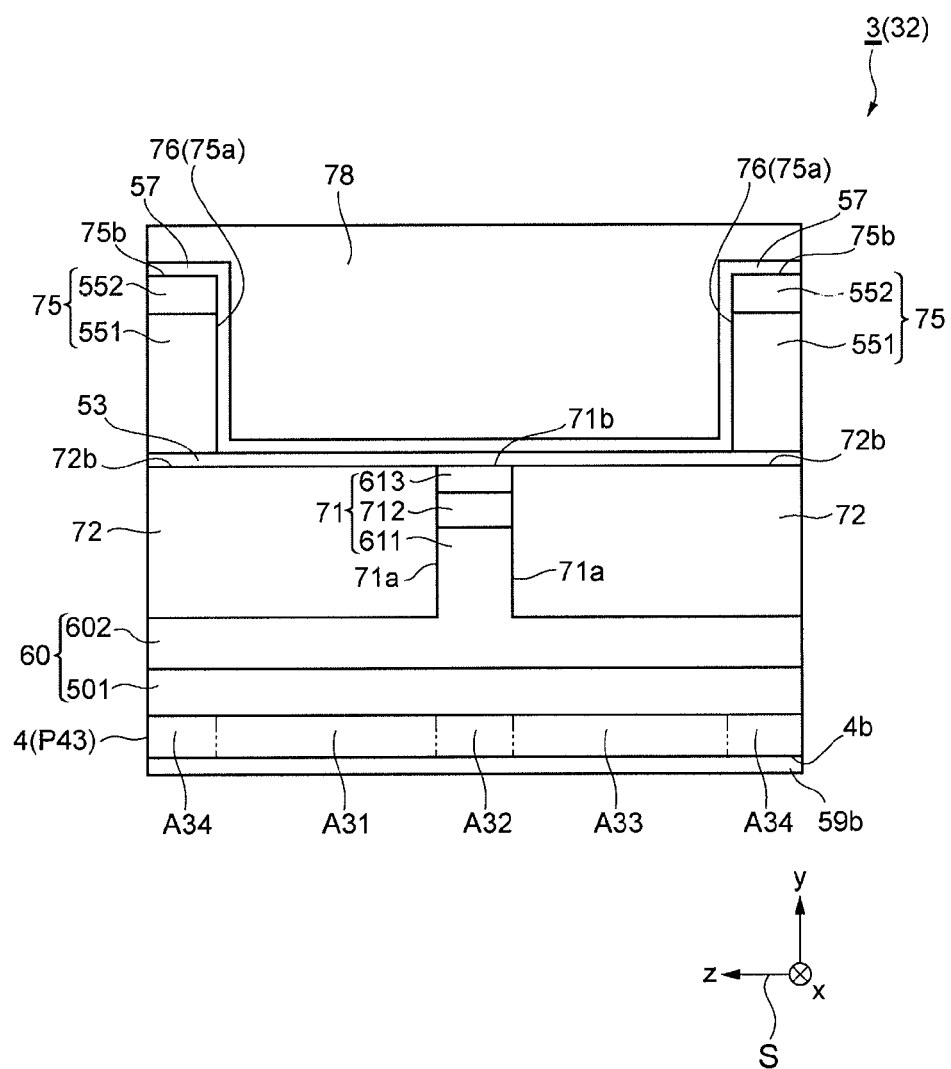
FIG. 5 is a schematic fragmentary cross-sectional view taken along line V-V in FIG. 1.

The isolation portion 3 will be described in detail below with reference to FIGS. 2 and 5. FIG. 5 is a schematic fragmentary cross-sectional view taken along line V-V in FIG. 1. The third portion P43 of the semiconductor substrate 4 includes a first region A31, a second region A32, a third region A33, and fourth regions A34. The first region A31, the second region A32, and the third region A33 are arranged in that order in the z-axis direction. The fourth regions A34 are located on a side of the first region A31 and a side of the third region A33 in the z-axis direction.

The isolation portion 3 includes the base portion 60 continuously formed from the optical modulator portion 2. In the isolation portion 3, the base portion 60 is provided on the first, second, third, and fourth regions A31, A32, A33, and A34.

The isolation portion 3 includes a lower mesa (third lower mesa) 71. Especially, the lower mesa 71 is, for example, a stripe-shaped mesa. Hereinafter, the lower mesa 71 is named as lower stripe-shaped mesa 71. The lower stripe-shaped mesa 71 is provided above the second region A32 and on the base portion 60. The height of the lower stripe-shaped mesa 71 from the upper surface of the base portion 60 is, for example, about 1.0 µm. The lower stripe-shaped mesa 71 extends in the x-axis direction. The lower stripe-shaped mesa 71 is formed integrally with, for example, the lower stripe-shaped mesa 61 of the optical modulator portion 2.

The lower stripe-shaped mesa 71 includes the semiconductor layer 611, a core layer (third core layer) 712, and the semiconductor layer 613 provided, in that order, on the base portion 60. The semiconductor layers 611 and 613 are continuously formed from the optical modulator portion 2. For example, the core layer 712 is formed integrally with the core layer 612 of the optical modulator portion 2, composed of the same material as that constituting the core layer 612, and subjected to butt-joint coupling to the core layer 512 of the light-emitting portion 1. That is, the core layer 712 optically couples the core layer 512 of the light-emitting portion 1 to the core layer 612 of the optical modulator portion 2.

The isolation portion 3 includes lower buried layers 72 (third lower buried layers) 72. The lower buried layers 72 are provided on side surfaces 71a of the lower stripe-shaped mesa 71 (i.e., side surfaces of the semiconductor layer 611, the core layer 712, and the semiconductor layer 613), above the first region A31, the third region A33, and the fourth regions A34, and on the base portion 60 so as to bury the lower stripe-shaped mesa 71. For example, the lower buried layers 72 are formed integrally with the lower buried layers 52 of the light-emitting portion 1 and the lower buried layers 62 of the optical modulator portion 2 and are composed of the same material as that constituting the lower buried layers 52 and the lower buried layers 62. Thus, the lower buried layers 72 are composed of a semi-insulating III-V group compound semiconductor, such as Fe-doped InP. Upper surfaces 72b of the lower buried layers 72 are substantially flush with the upper surface 71b of the lower stripe-shaped mesa 71 (i.e., a surface of the semiconductor layer 613).

The isolation portion 3 includes the semiconductor layer 53 continuously formed from the light-emitting portion 1. In the isolation portion 3, the semiconductor layer 53 is arranged above the first, second, third, and fourth regions A31, A32, A33, and A34 and on the lower stripe-shaped mesa 71 and the lower buried layers 72.

The isolation portion 3 includes terraces 75. The terraces 75 are provided above the fourth regions A34 and on the semiconductor layer 53. Each of the terraces 75 includes the cladding layer 551 and the contact layer 552 continuously formed from the light-emitting portion 1. For example, the terraces 75 are formed integrally with the terraces 55 of the light-emitting portion 1 and the terraces 65 of the optical modulator portion 2.

The isolation portion 3 includes an isolation groove 76. The isolation groove 76 is provided above the first, second, and third regions A31, A32, and A33, the lower stripe-shaped mesa 71, and the lower buried layers 72, and on the semiconductor layer 53. The isolation groove 76 is defined by side surfaces 75a of the terraces 75 and opposing end faces 54c and 64c of the upper stripe-shaped mesa 54 and the upper stripe-shaped mesa 64. That is, the isolation groove 76 is provided between the upper stripe-shaped mesa 54 of the light-emitting portion 1 and the upper stripe-shaped mesa 64 of the optical modulator portion 2. For example, the isolation groove 76 is formed integrally with the trenches 56 of the light-emitting portion 1 and the trenches 66 of the optical modulator portion 2.

The isolation portion 3 includes the protective film 57 continuously formed from the light-emitting portion 1. In the isolation portion 3, the protective film 57 is arranged on inner surfaces of the isolation groove 76 (i.e., the surface of the semiconductor layer 53, the side surfaces 75a of the terraces 75, the end face 54c of the upper stripe-shaped mesa 54, and the end face 64c of the upper stripe-shaped mesa 64) and upper surfaces 75b of the terraces 75.

The isolation portion 3 includes a resin component 78. The resin component 78 is provided above the first, second, third, and fourth regions A31, A32, A33, and A34 and on the protective film 57. Part of the resin component 78 is arranged in the isolation groove 76, so that the isolation groove 76 is filled therewith. For example, the resin component 78 is formed integrally with the upper buried layers 58 of the light-emitting portion 1 and the upper buried layers 68 of the optical modulator portion 2 and composed of the same material as that constituting the upper buried layers 58 and the upper buried layers 68.

A method for producing the semiconductor integrated device 100 having the foregoing structure will be described in detail below with reference to FIGS. 6 to 16C. FIGS. 6 to 16C each illustrate a main step in the method for producing the semiconductor integrated device 100. In the following description, we mainly focus attention on a region AR in FIG. 1. FIGS. 7A to 9B are schematic cross-sectional views illustrating the region AR in the waveguiding direction of light. FIGS. 10 to 15 are perspective views of the region AR. FIGS. 16A, 16B, and 16C are schematic cross-sectional views taken along lines IV-IV, and V-V, respectively, in FIG. 1.

Figure 6:
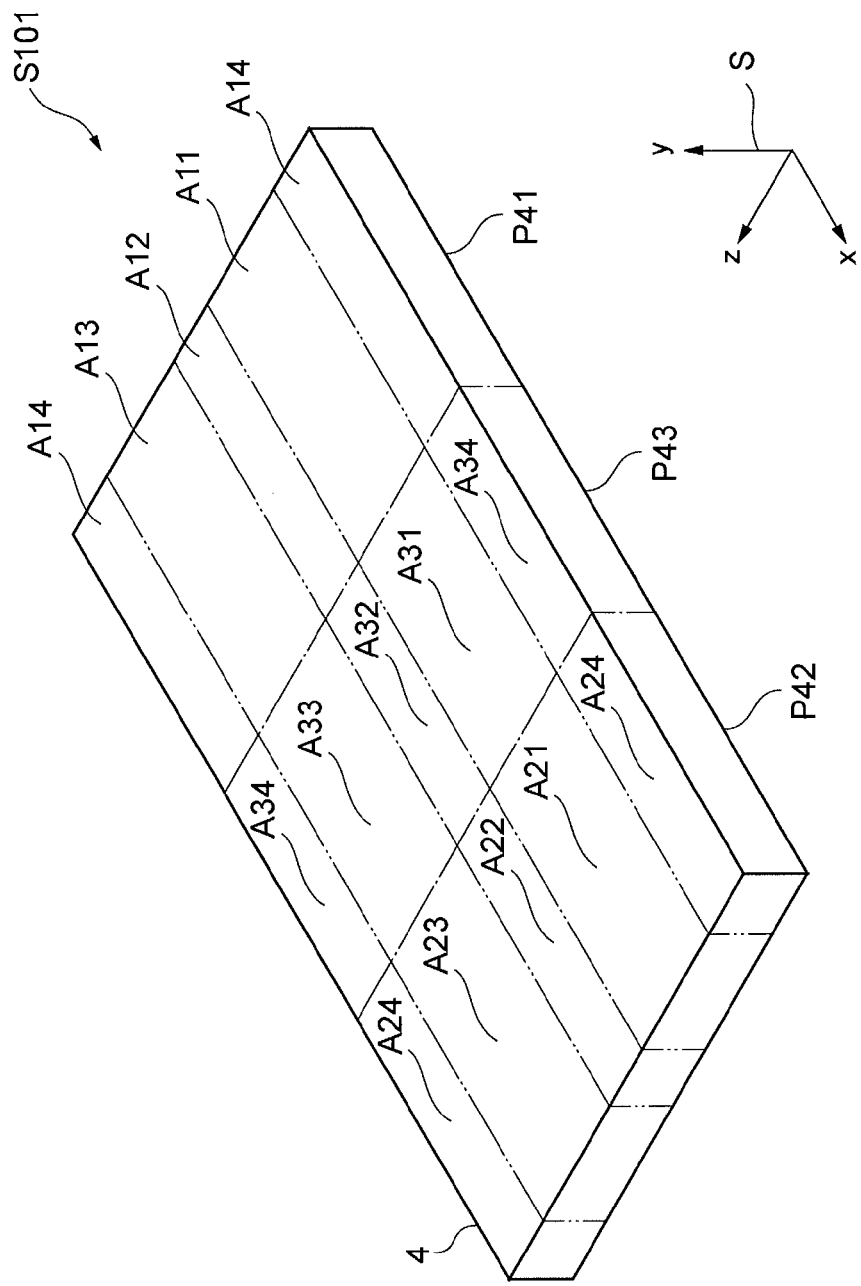
FIG. 6 illustrates a main step in a method for producing a semiconductor integrated device according to an embodiment of the present invention.

In this method, the semiconductor substrate 4 is prepared as illustrated in FIG. 6 (step S101). In the subsequent step, the buffer layer 501 and a semiconductor layer 502A configured to be formed into the grating layer 502 are formed in sequence on the first, second, and third portions P41, P42, and P43 of the semiconductor substrate 4 as illustrated in FIG. 7A (step S102). In step S102, the buffer layer 501 and a semiconductor layer SR are grown in sequence on the semiconductor substrate 4 as illustrated in 7B. For this growth and the growth of the following semiconductor layers, a metal-organic vapor phase epitaxy (MOVPE) method may be employed.

Subsequently, a mask layer having a pattern to form a diffraction grating is formed on the semiconductor layer SR by, for example, an electron-beam exposure technique or nanoimprint lithography. The semiconductor layer SR is etched by a dry etching process with the mask layer. This results in the semiconductor layer 502A having a pattern of periodic projections and recesses for a diffraction grating. In the dry etching process, for example, reactive ion etching (RIE) using a gas mixture of methane gas ($CH_4$) and hydrogen gas ($H_2$) as an etching gas may be employed. Note that the pattern of projections and recesses for the diffraction grating may be provided only on the first portion P41 of the semiconductor substrate 4.

In the subsequent step, a semiconductor layer 503A configured to form the semiconductor layers 503 and 511, a semiconductor layer 512A configured to form the core layer 512, and a semiconductor layer 513A configured to form the capping layer 513 are grown, in that order, on the semiconductor layer 502A as illustrated in FIG. 8A (step S103). A stacked semiconductor layer 150 configured to form the light-emitting portion 1 is formed on the first, second, and third portions P41, P42, and P43 of the semiconductor substrate 4 through step S103.

In the subsequent step, a mask M0 is formed on the stacked semiconductor layer 150 (i.e., on the semiconductor layer 513A) as illustrated in FIG. 8B (step S104). The mask M0 is provided on the stacked semiconductor layer 150 located above the first portion P41 of the semiconductor substrate 4. Thus, the stacked semiconductor layer 150 is exposed from the mask M0 at a region located above the second portion P42 and the third portion P43 of the semiconductor substrate 4. The mask M0 is formed by a process described below. A mask layer is formed on the stacked semiconductor layer 150 by a chemical vapor deposition method. The resulting mask layer is then patterned by photolithography and etching with buffered hydrofluoric acid (BHF). Thereby, the mask M0 having the foregoing pattern is formed. The mask M0 is formed of a dielectric film composed of, for example, $SiO_2$ or SiN. The mask M0 may have a thickness of, for example, about 200 nm.

In the subsequent step, the stacked semiconductor layer 150 is etched with the mask M0 to form a stacked semiconductor layer (first stacked semiconductor layer) 160 as illustrated in FIG. 9A (step S105). The stacked semiconductor layer 160 is formed on the first portion P41 of the semiconductor substrate 4. This etching may be performed by wet etching with an etchant, such as a mixture of HCl and hydrogen peroxide. In this case, the buffer layer 501 functions as an etch-stop layer. This etching is continued until the buffer layer is exposed.

In step S105, the semiconductor layers 513A, 512A, 503A, and 502A are etched to form semiconductor layers 513B, 512B, and 503B and the grating layer 502, respectively. The stacked semiconductor layer 160 includes part of the buffer layer 501, the grating layer 502, and the semiconductor layers 503B, 512B, and 513B stacked, in that order, on the semiconductor substrate 4.

In the subsequent step, a stacked semiconductor layer (second stacked semiconductor layer) 170 configured to form the optical modulator portion 2 and the isolation portion 3 is formed on the second portion P42 and the third portion P43 of the semiconductor substrate 4 as illustrated in FIG. 9B (step S106). In step S106, a semiconductor layer 602B configured to form the semiconductor layers 602 and 611, a semiconductor layer 612B configured to form the core layers 612 and 712, and a semiconductor layer 613B configured to form the semiconductor layer 613 are grown, in that order, on the buffer layer 501 using the mask M0 as a selective growth mask. The stacked semiconductor layer 170 includes part of the buffer layer 501 and the semiconductor layers 602B, 612B, and 613B stacked, in that order, on the semiconductor substrate 4.

Figure 10:
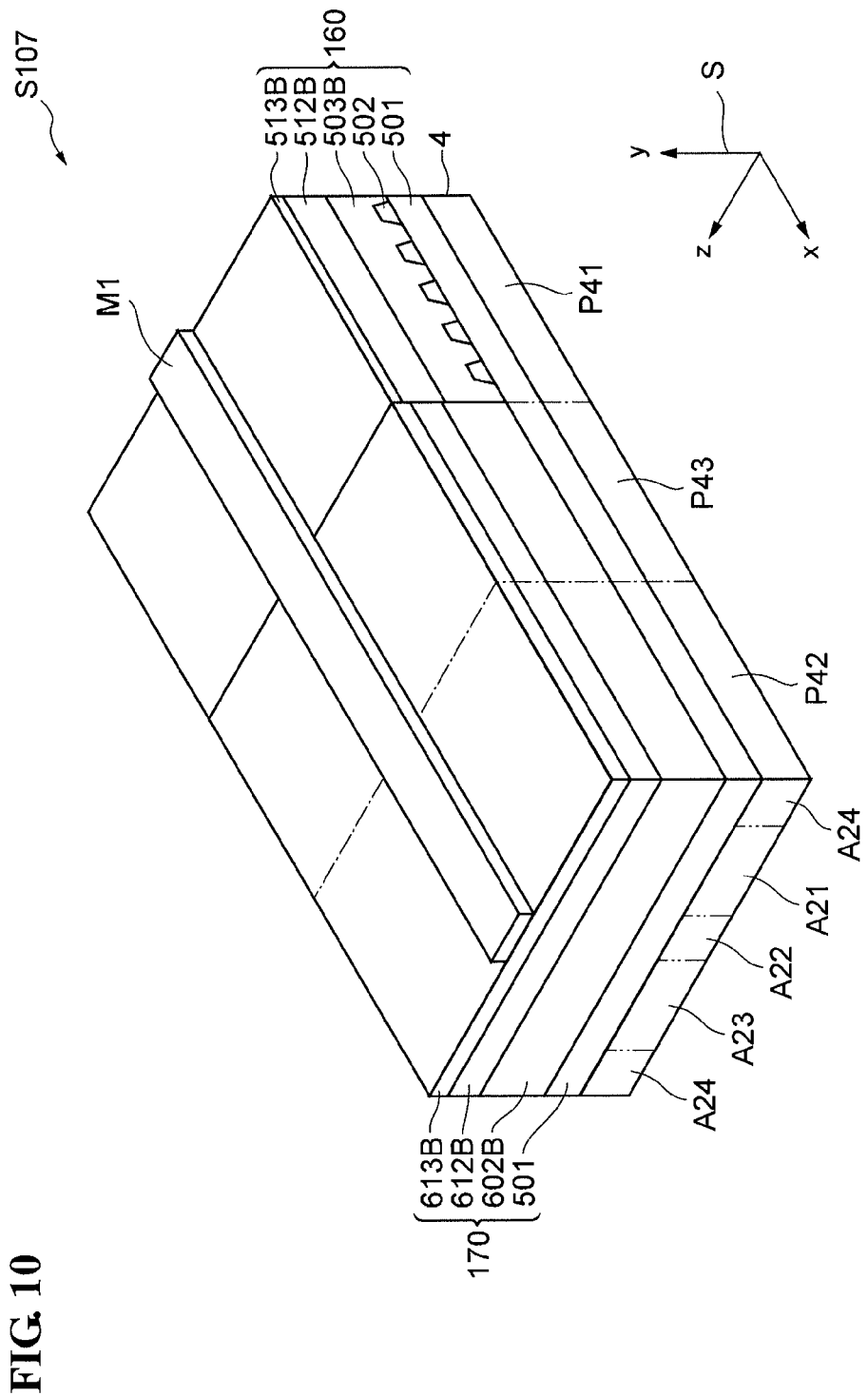
FIG. 10 illustrates a main step in a method for producing a semiconductor integrated device according to an embodiment of the present invention.

In the subsequent step, after the removal of the mask M0, a mask (first mask) M1 is formed on the stacked semiconductor layer 160 and the stacked semiconductor layer 170 as illustrated in FIG. 10 (step S107). The mask M1 has a stripe shape and defines the lower stripe-shaped mesa 51 of the light-emitting portion 1, the lower stripe-shaped mesa 61 of the optical modulator portion 2, and the lower stripe-shaped mesa 71 of the isolation portion 3. The mask M1 is provided above the second regions A12, A22, and A32 of the semiconductor substrate 4.

The mask M1 may be formed by, for example, the following process. A mask layer is formed on the stacked semiconductor layers 160 and 170 by a chemical vapor deposition method. A resist pattern is formed on the mask layer by photolithography. The pattern is transferred to the mask layer. Thereby, the mask M1 is formed by the process. The mask M1 is formed of a dielectric film composed of, for example, $SiO_2$ or SiN. The mask M1 has a thickness of, for example, about 300 nm.

Figure 11:
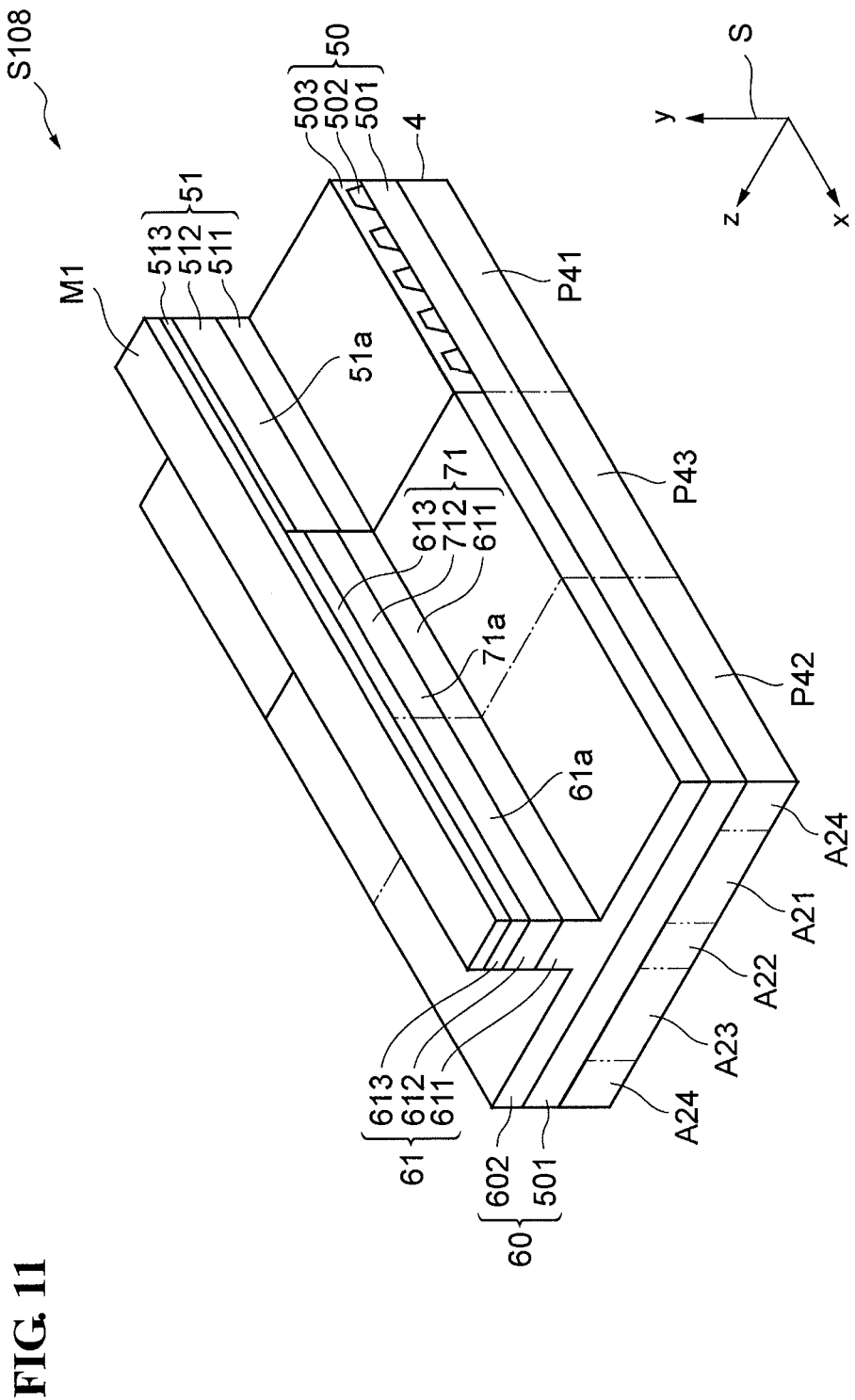
FIG. 11 illustrates a main step in a method for producing a semiconductor integrated device according to an embodiment of the present invention.

In the subsequent step, the stacked semiconductor layers 160 and 170 are etched with the mask M1 as illustrated in FIG. 11. This etching results in the formation of the base portion 50 and the lower stripe-shaped mesa 51 from the stacked semiconductor layer 160. This etching also results in the formation of the base portion 60, the lower stripe-shaped mesa 61, and the lower stripe-shaped mesa 71 from the stacked semiconductor layer 170 (step S108). Thus, the lower stripe-shaped mesa 51, the lower stripe-shaped mesa 61, and the lower stripe-shaped mesa 71 are formed in one step. For example, reactive ion etching (RIE) using a $Cl_2$-based etchant may be employed for this etching.

This etching results in, on the first portion P41 of the semiconductor substrate 4, the formation of the semiconductor layers 503 and 511 from the semiconductor layer 503B, the core layer 512 from the semiconductor layer 512B, and the capping layer 513 from the semiconductor layer 513B. This etching also results in, on the second portion P42 and the third portion P43 of the semiconductor substrate 4, the formation of the semiconductor layers 602 and 611 from the semiconductor layer 602B, the core layers 612 and 712 from the semiconductor layer 612B, and the semiconductor layer 613 from the semiconductor layer 613B.

Figure 12:
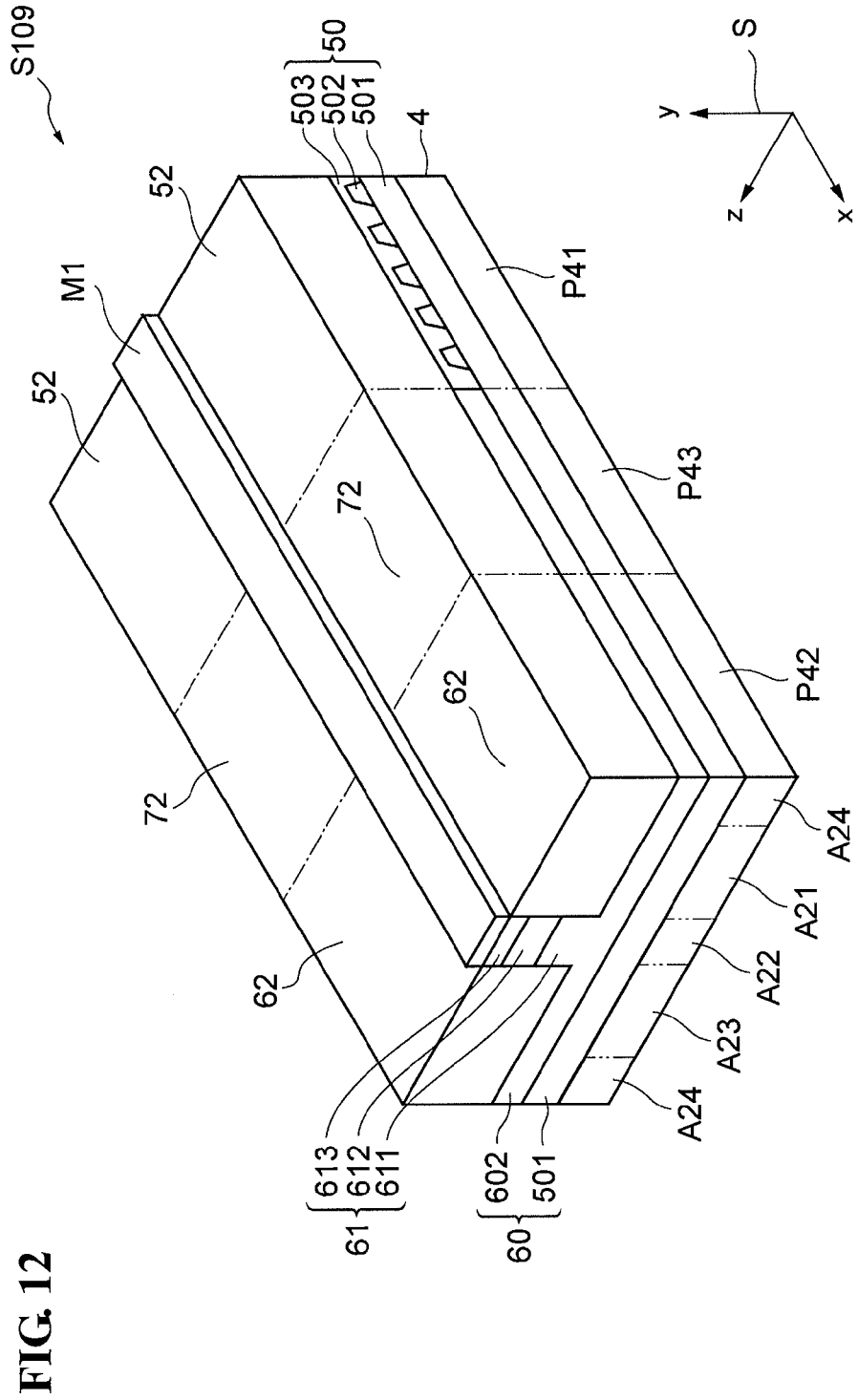
FIG. 12 illustrates a main step in a method for producing a semiconductor integrated device according to an embodiment of the present invention.

In the subsequent step, a semiconductor is grown on the base portions 50 and 60 using the mask M1 as a selective growth mask. This step results in the formation of the lower buried layers 52, the lower buried layers 62, and the lower buried layers 72 as illustrated in FIG. 12 (step S109). Thus, the lower buried layers 52, the lower buried layers 62, and the lower buried layers 72 are formed in one step. Note that before this growth, a portion damaged by the etching in step S108 may be removed by, for example, wet etching with a $H_2SO_4$-based etchant.

The lower buried layers 52 are formed on the side surfaces 51a of the lower stripe-shaped mesa 51 and above the first region A11, the third region A13, and the fourth regions A14 so as to bury the lower stripe-shaped mesa 51 therewith. The lower buried layers 62 are formed on the side surfaces 61a of the lower stripe-shaped mesa 61 and above the first region A21, the third region A23, and the fourth regions A24 so as to bury the lower stripe-shaped mesa 61 therewith. The lower buried layers 72 are formed on the side surfaces 71a of the lower stripe-shaped mesa 71 and above the first region A31, the third region A33, and the fourth regions A34 so as to bury the lower stripe-shaped mesa 71 therewith.

Figure 13:
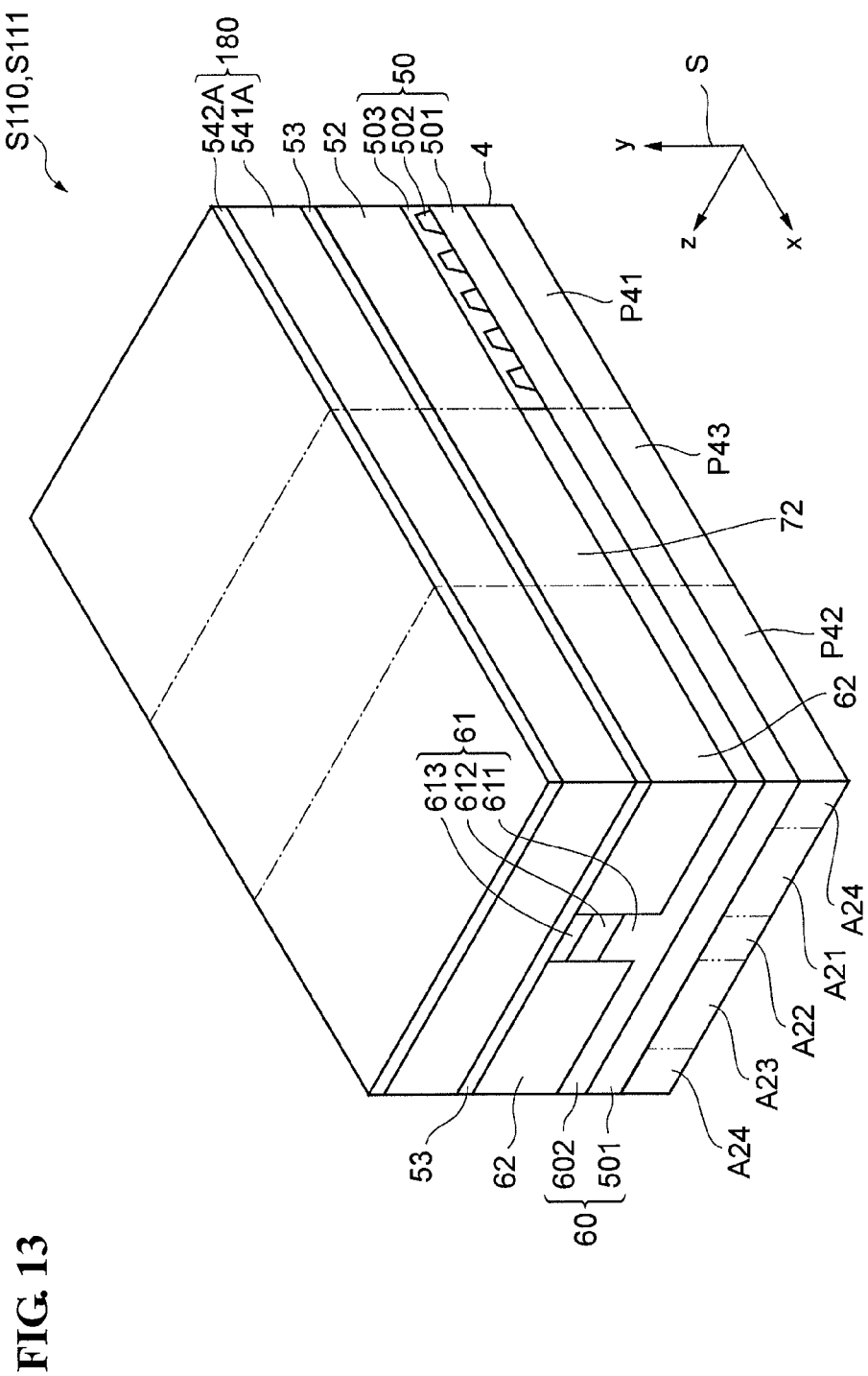
FIG. 13 illustrates a main step in a method for producing a semiconductor integrated device according to an embodiment of the present invention.

In the subsequent step, the mask M1 is removed by, for example, wet etching with BHF. As illustrated in FIG. 13, the semiconductor layer 53 is then formed over the first portion P41, the second portion P42, the third portion P43, the lower stripe-shaped mesa 51, the lower stripe-shaped mesa 61, the lower stripe-shaped mesa 71, the lower buried layers 52, the lower buried layers 62, and the lower buried layers 72 (step S110).

In the subsequent step, a stacked semiconductor layer (third stacked semiconductor layer) 180 used for the light-emitting portion 1, the optical modulator portion 2, and the isolation portion 3 is formed above the first portion P41, the second portion P42, and the third portion P43 and on the semiconductor layer 53 as illustrated in FIG. 13 (step S111). The stacked semiconductor layer 180 includes a semiconductor layer 541A configured to form the cladding layers 541 and 551 and a semiconductor layer 542A configured to form the contact layers 542 and 552. In step S111, thus, the semiconductor layer 541A and the semiconductor layer 542A are grown, in that order, on the semiconductor layer 53.

Figure 14:
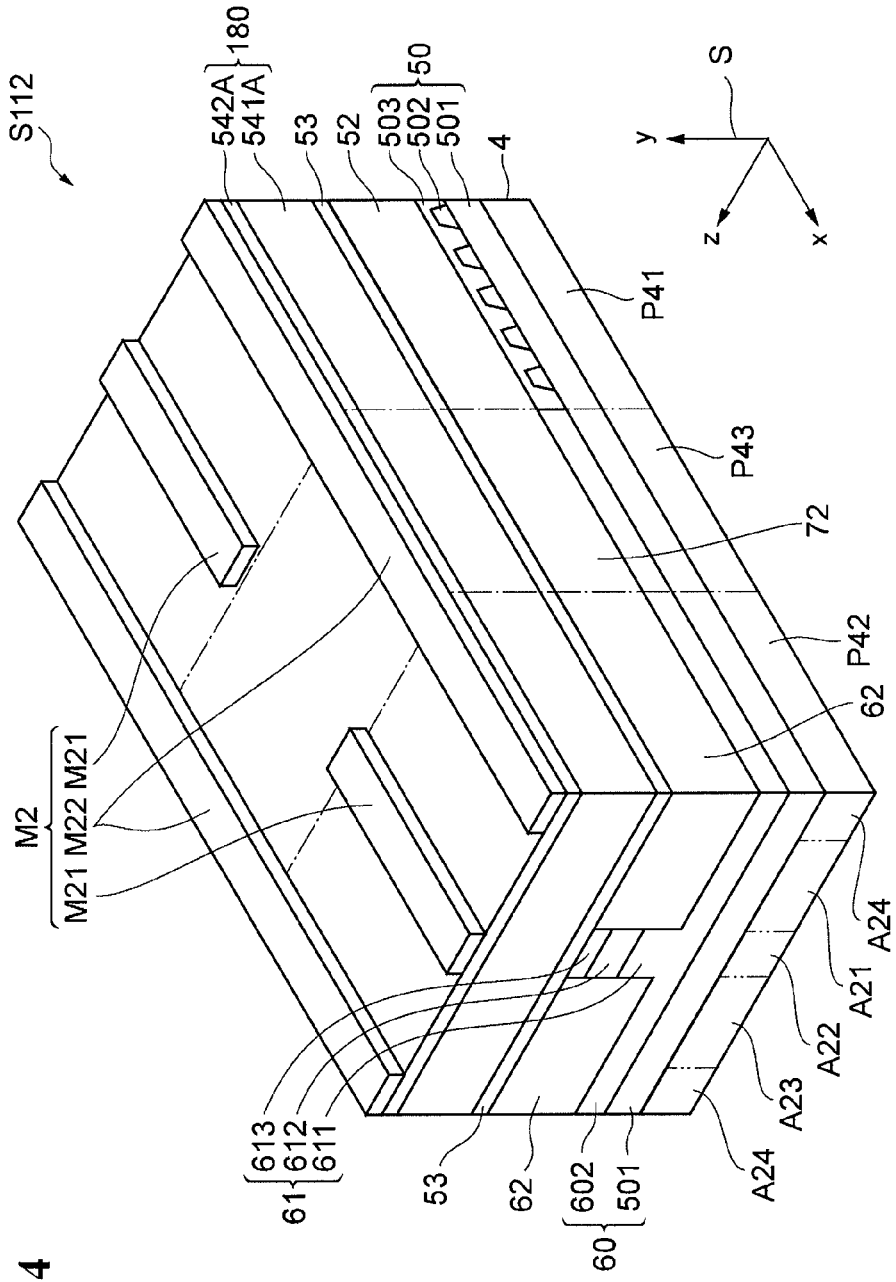
FIG. 14 illustrates a main step in a method for producing a semiconductor integrated device according to an embodiment of the present invention.

In the subsequent step, a mask (second mask) M2 is formed on the stacked semiconductor layer 180 as illustrated in FIG. 14 (step S112). The mask M2 has a stripe shape. The mask M2 includes first mask portions M21 that define the upper stripe-shaped mesa 54 and the upper stripe-shaped mesa 64 and second mask portions M22 that define the terraces 55, 65, and 75. The first mask portions M21 are arranged above the second regions A12 and A22. The second mask portions M22 are arranged above the fourth regions A14, A24, and A34. The mask M2 also has an opening that define the trenches 56 and 66 and the isolation groove 76. The opening is provided above the first regions A11, A21, and A31, the second region A32, and the third regions A13, A23, and A33.

Figure 15:
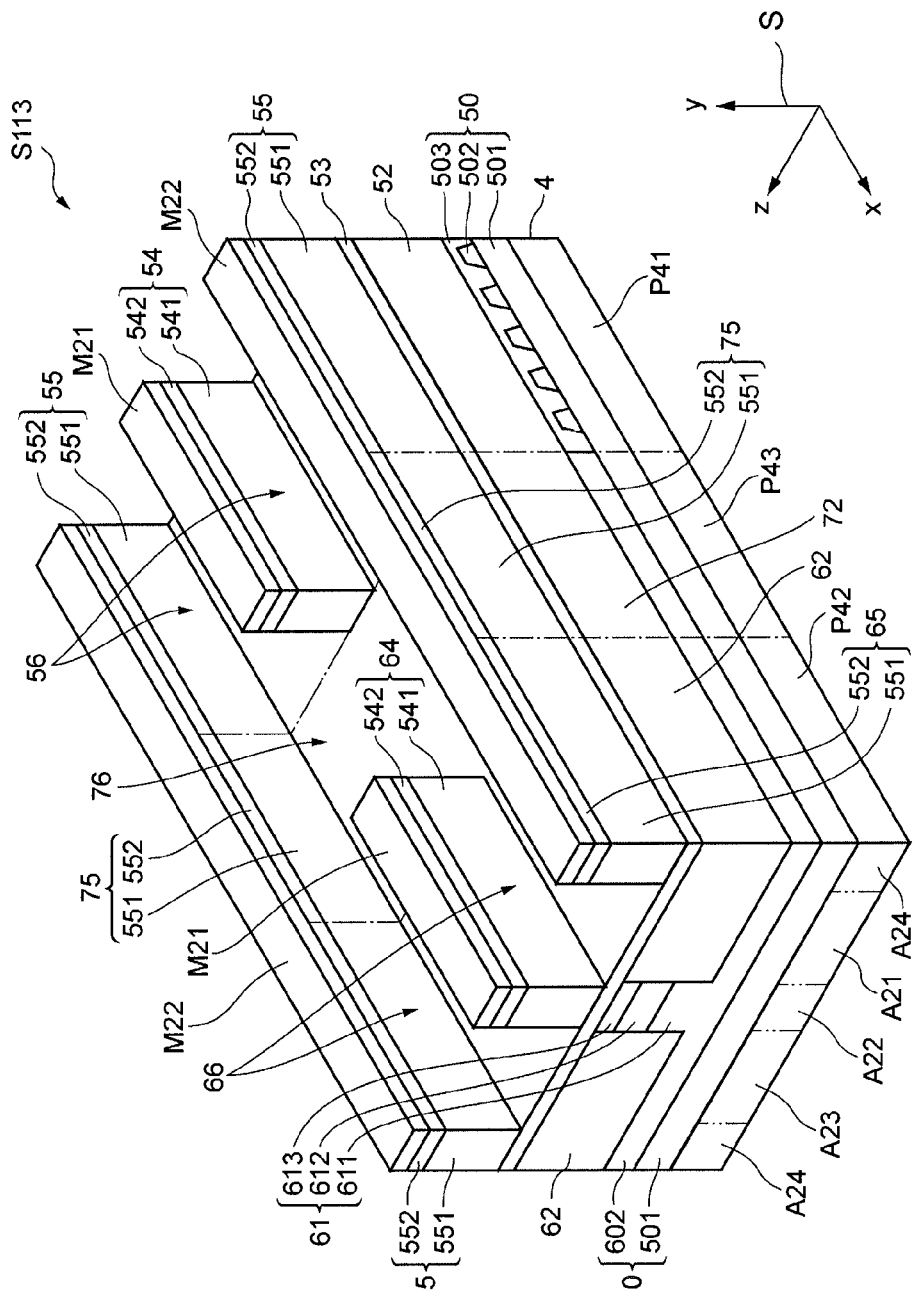
FIG. 15 illustrates a main step in a method for producing a semiconductor integrated device according to an embodiment of the present invention.
Figure 16A:
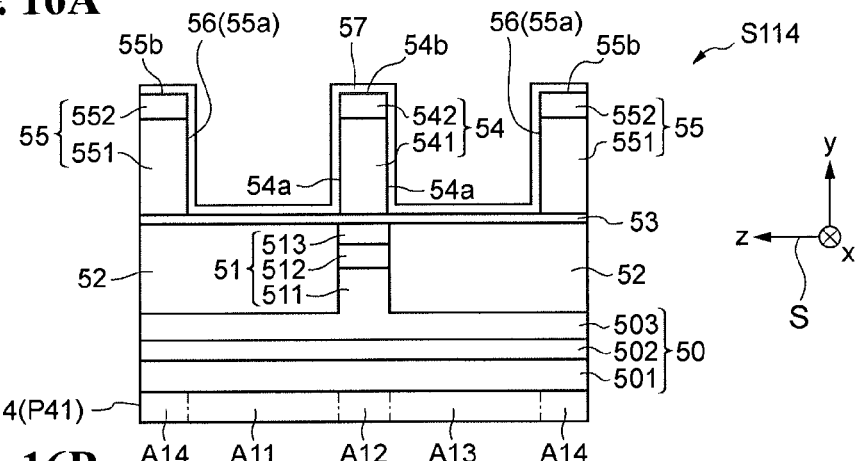
FIGS. 16A to 16C each illustrate a main step in a method for producing a semiconductor integrated device according to an embodiment of the present invention.
Figure 16B:
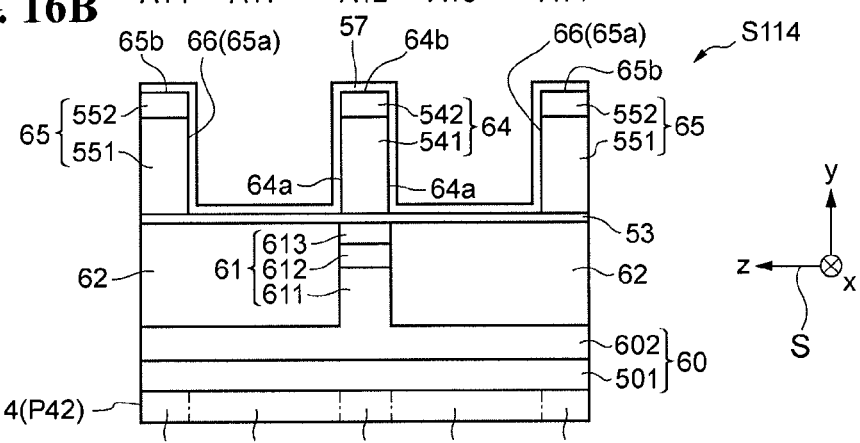
Figure 16C:
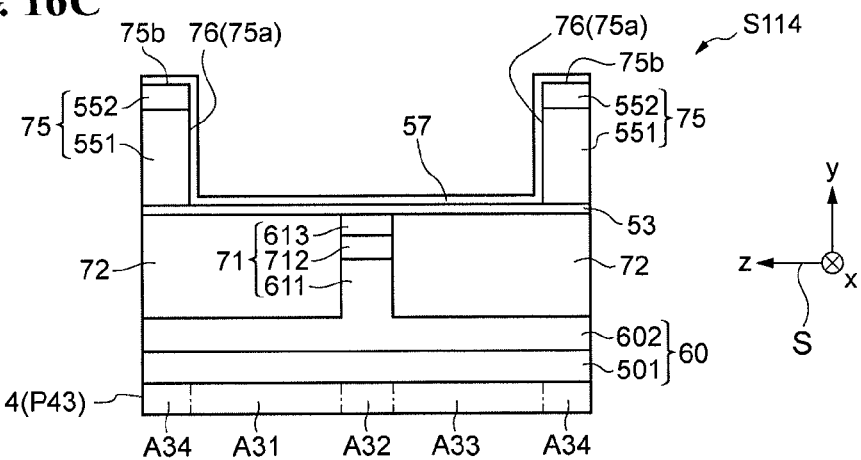

In the subsequent step, the stacked semiconductor layer 180 is etched with the mask M2 as illustrated in FIG. 15. This etching step results in the formation of the upper stripe-shaped mesas 54 and 64, the terraces 55, 65, and 75, the trenches 56 and 66, and the isolation groove 76 (step S113). Thus, the upper stripe-shaped mesas 54 and 64, the terraces 55, 65, and 75, the trenches 56 and 66, and the isolation groove 76 are formed in one step. In this case, the mesa width of the upper stripe-shaped mesas 54 and 64 is smaller than that of the lower stripe-shaped mesas 51 and 61.

This etching in step S113 results in the formation of the cladding layers 541 and 551 from the semiconductor layer 541A and the contact layers 542 and 552 from the semiconductor layer 542A. For example, reactive ion etching (RIE) using a gas mixture of methane gas ($CH_4$) and hydrogen gas ($H_2$) as an etching gas may be employed for this etching. In this etching, when the semiconductor layer 53 is formed of a semiconductor layer containing Al, the etching rate of the semiconductor layer 53 can be smaller than those of other Al-free semiconductor layers. In this case, the semiconductor layer 53 functions as an etch-stop layer. For example, the semiconductor layer 53 may be composed of AlInAs.

In the subsequent step, the mask M2 is removed by, for example, wet etching using BHF. The protective film 57 is then formed as illustrated in FIGS. 16A to 16C (step S114). The protective film 57 may be formed by, for example, a chemical vapor deposition method. The protective film 57 is formed of a dielectric film composed of, for example, $SiO_2$ or SiN. The arrangement of the protective film 57 prevents the delamination of the upper buried layer 58, the upper buried layer 68, and the resin component 78 to be formed in the subsequent steps and prevents the contamination of these semiconductor layers. Note that before the formation of the protective film 57, a portion damaged by the etching in step S113 may be removed by, for example, wet etching using an HCl-based etchant.

Figure 17A:
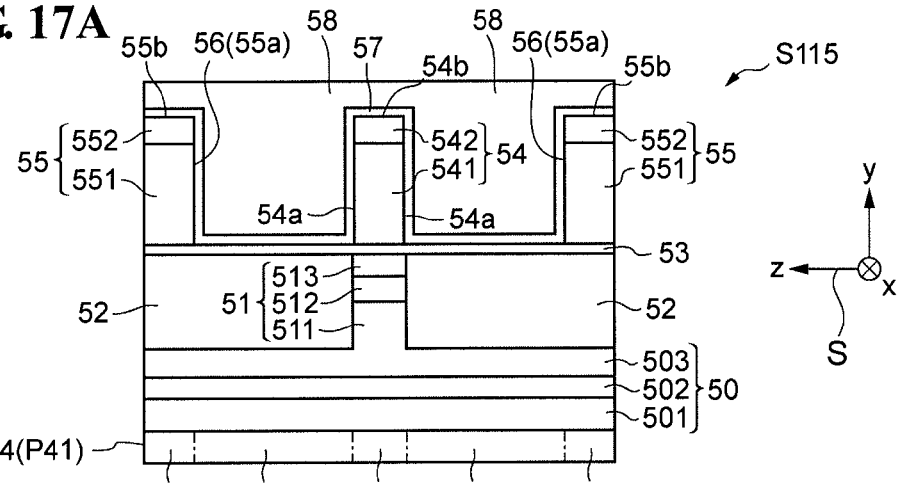
FIGS. 17A to 17C each illustrate a main step in a method for producing a semiconductor integrated device according to an embodiment of the present invention.
Figure 17B:
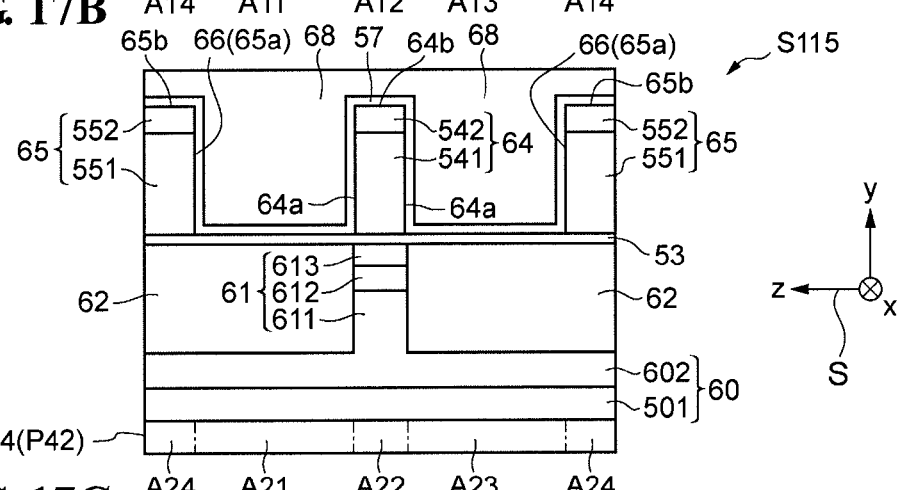
Figure 17C:
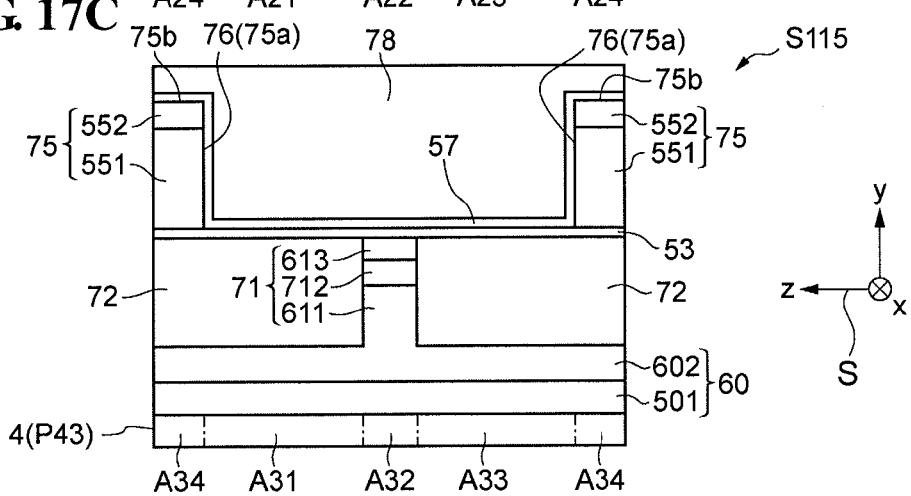

In the subsequent step, the upper buried layers 58, the upper buried layers 68, and the resin component 78 are formed as illustrated in FIGS. 17A to 17C (step S115). The upper buried layer 58 is formed so as to cover the side surfaces 54a of the upper stripe-shaped mesa 54 and bury the upper stripe-shaped mesa 54. The upper buried layer 68 is formed so as to cover the side surfaces 64a of the upper stripe-shaped mesa 64 and bury the upper stripe-shaped mesa 64. The upper buried layer 58, the upper buried layer 68, and the resin component 78 are formed in one step by, for example, filling the trenches 56 and 66 and the isolation groove 76 with a resin material, such as a BCB resin.

Subsequently, openings located above the upper stripe-shaped mesas 54 and 64 are formed in the protective film 57 and the upper buried layers 58 and 68 as illustrated in FIGS. 3 and 4. The upper electrodes 59a and 69a that are in contact with the upper surfaces 54b and 64b of the upper stripe-shaped mesas 54 and 64 are formed through the openings. Then, the back surface of the semiconductor substrate 4 is polished to have a thickness of about 100 µm. Then, the lower electrode 59b is formed on the back surface 4b of the semiconductor substrate 4. Thereby, the semiconductor integrated device 100 is produced.

As has been described above, in the semiconductor integrated device 100 according to this embodiment, the light-emitting portion 1 includes the lower stripe-shaped mesa 51 including the core layer 512 and the upper stripe-shaped mesa 54 provided above the lower stripe-shaped mesa 51. The lower stripe-shaped mesa 51 is buried by the lower buried layers 52 composed of a semi-insulating semiconductor. Thus, in the semiconductor integrated device 100, an increase in non-radiative recombination in the light-emitting portion 1 is suppressed.

The optical modulator portion 2 includes the lower stripe-shaped mesa 61 including the core layer 612 and the upper stripe-shaped mesa 64 provided above the lower stripe-shaped mesa 61. The upper stripe-shaped mesa 64 is buried by the upper buried layers 68 composed of a resin material having a relatively low refractive index (dielectric constant). Thus, in the semiconductor integrated device 100, the optical modulator portion 2 has a low capacitance. And optical confinement in the optical modulator portion 2 is improved. As described above, the semiconductor integrated device 100 ensures both properties of the light-emitting portion 1 and the optical modulator portion 2.

In the isolation portion 3 configured to electrically isolate the light-emitting portion 1 from the optical modulator portion 2, the isolation groove 76 is provided between the upper stripe-shaped mesas 54 and 64 by etching the cladding layer 541 and the contact layer 542 at the isolation portion 3. Thus, in the semiconductor integrated device 100, the light-emitting portion 1 is assuredly isolated from the optical modulator portion 2.

In the semiconductor integrated device 100, when the semiconductor layer 53 composed of AlInAs has a thickness of 50 nm or more, the semiconductor layer 53 sufficiently functions as an etch-stop layer. When the semiconductor layer 53 has a thickness of 100 nm or less, an increase in resistance is avoided.

The BCB resin constituting the resin component 78 is a dielectric material and transparent to light in a wavelength range (1.3 µm to 1.5 µm) used in optical fiber communication. Thus, the use of the BCB resin as a resin material constituting the resin component 78 effectively isolates the light-emitting portion 1 from the optical modulator portion 2.

When the upper buried layers 58 and 68 are composed of the BCB resin, a void is formed in the layers composed of the BCB resin, especially in the case of the upper buried layers 58 and 68 having large volumes. In the semiconductor integrated device 100, however, the layers composed of the BCB resin each have a relatively small volume because the trenches 56 and 66 are defined by the terraces 55 and 65. This inhibits the formation of a void in the layers composed of the BCB resin.

Here, it is possible to produce the semiconductor integrated device 100 capable of providing the foregoing effects by the method for producing a semiconductor integrated device according to the embodiment. In particular, according to this method, the upper stripe-shaped mesas 54 and 64, the terraces 55, 65, and 75, the trenches 56 and 66, and the isolation groove 76 are formed in one step, thereby resulting in the simplification of the steps of producing the semiconductor integrated device 100.

In the method for producing a semiconductor integrated device according to the embodiment, in the process of etching the stacked semiconductor layer 180 in step S113, the use of dry etching with a gas mixture of methane gas ($CH_4$) and hydrogen gas ($H_2$) results in a large difference in etching rate between InP constituting the semiconductor layer 541A and the AlInAs constituting the semiconductor layer 53 of the stacked semiconductor layer 180. Therefore, the semiconductor layer 53 functions as an etch-stop layer.

The foregoing embodiment is a mere embodiment of a semiconductor integrated device and a method for producing a semiconductor integrated device according to the present invention. Thus, the semiconductor integrated device and the method for producing a semiconductor integrated device according to the present invention are not limited to the semiconductor integrated device 100 and the method for producing the semiconductor integrated device 100 described above. Thus, various changes may be made in the semiconductor integrated device 100 and the method for producing the semiconductor integrated device 100 according to the present invention without departing from the scope as defined in the following claims.

What is claimed is:

1. A semiconductor integrated device comprising:
a substrate including a first portion, a second portion, and a third portion arranged in a predetermined direction, the third portion being arranged between the first portion and the second portion;
a light-emitting portion including a first lower mesa provided above the first portion, a first lower buried layer provided on a side surface of the first lower mesa and above the first portion, a first upper mesa provided above the first lower mesa, and a first upper buried layer provided on a side surface of the first upper mesa and above the first lower buried layer, the first lower mesa including a first core layer; and
an optical modulator portion including a second lower mesa provided above the second portion, a second lower buried layer provided on a side surface of the second lower mesa and above the second portion, a second upper mesa provided above the second lower mesa, and a second upper buried layer provided on a side surface of the second upper mesa and above the second lower buried layer, the second lower mesa including a second core layer,
wherein the first core layer and the second core layer are optically coupled to each other,
the first lower buried layer and the second lower buried layer are composed of a semi-insulating semiconductor, and
the first upper buried layer and the second upper buried layer are composed of a resin material.

2. The semiconductor integrated device according to claim 1, further comprising:
an isolation portion provided above the third portion,
wherein the isolation portion includes a third lower mesa provided above the third portion, a third lower buried layer provided on a side surface of the third lower mesa and above the third portion, an isolation groove provided above the third lower mesa and the third lower buried layer and provided between the first upper mesa and the second upper mesa, and a resin component arranged in the isolation groove and composed of the resin material, and
wherein the third lower mesa includes a third core layer that optically couples the first core layer to the second core layer.

3. The semiconductor integrated device according to claim 1, further comprising:
a semiconductor layer arranged on the first lower mesa, the second lower mesa, the first lower buried layer, and the second lower buried layer, the semiconductor layer containing Al,
wherein the first upper mesa, the second upper mesa, the first upper buried layer, and the second upper buried layer are provided on the semiconductor layer containing Al.

4. The semiconductor integrated device according to claim 3,
wherein the semiconductor layer is composed of AlInAs.

5. The semiconductor integrated device according to claim 1,
wherein the first lower mesa and the first upper mesa include a stripe-shaped mesa structure extending in the predetermined direction,
the second lower mesa and the second upper mesa include a stripe-shaped mesa structure extending in the predetermined direction,
the center of the first lower mesa in the width direction intersecting with the predetermined direction is substantially matched to the center of the first upper mesa in the width direction intersecting with the predetermined direction, and
the center of the second lower mesa in the width direction intersecting with the predetermined direction is substantially matched to the center of the second upper mesa in the width direction intersecting with the predetermined direction.

6. The semiconductor integrated device according to claim 1,
wherein the first lower mesa and the first upper mesa include a stripe-shaped mesa structure extending in the predetermined direction,
the second lower mesa and the second upper mesa include a stripe-shaped mesa structure extending in the predetermined direction,
the width of the first upper mesa in a direction intersecting with the predetermined direction is smaller than the width of the first lower mesa in a direction intersecting with the predetermined direction, and
the width of the second upper mesa in a direction intersecting with the predetermined direction is smaller than the width of the second lower mesa in a direction intersecting with the predetermined direction.

7. The semiconductor integrated device according to claim 1,
wherein the first core layer of the first lower mesa includes an active layer configured to generate light, and
the second core layer of the second lower mesa includes a layer configured to modulate light from the first core layer.

8. The semiconductor integrated device according to claim 1,
wherein the semi-insulating semiconductor is composed of Fe-doped InP.

9. The semiconductor integrated device according to claim 1,
wherein the resin material is composed of a bisbenzocyclobutene (BCB) resin.

10. The semiconductor integrated device according to claim 1,
wherein the optical modulator portion includes a Mach-Zehnder optical modulator including a waveguide that includes the second lower mesa, and the second upper mesa provided above the second lower mesa.

* * * * *